(12) United States Patent
Lim

(10) Patent No.: US 10,261,934 B2
(45) Date of Patent: Apr. 16, 2019

(54) METHOD AND APPARATUS FOR PROVIDING INTERFACE

(71) Applicant: Samsung Electronics Co., Ltd., Suwon-si, Gyeonggi-do (KR)

(72) Inventor: Hoyeong Lim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 172 days.

(21) Appl. No.: 15/151,879

(22) Filed: May 11, 2016

(65) Prior Publication Data
US 2016/0364360 A1   Dec. 15, 2016

(30) Foreign Application Priority Data

Jun. 10, 2015   (KR) .................. 10-2015-0082043

(51) Int. Cl.
*G06F 13/42* (2006.01)
*G06F 13/38* (2006.01)
(Continued)

(52) U.S. Cl.
CPC .......... *G06F 13/4282* (2013.01); *G06F 1/266* (2013.01); *G06F 13/385* (2013.01);
(Continued)

(58) Field of Classification Search
None
See application file for complete search history.

(56) References Cited

U.S. PATENT DOCUMENTS 7,699,663 B1 *  4/2010  Little ................. H01R 13/6471
                                                       439/660
8,064,593 B1    11/2011  Dobie
(Continued)

FOREIGN PATENT DOCUMENTS

CN          201319596 Y      9/2009
CN          101601001 A     12/2009
(Continued)

OTHER PUBLICATIONS

Chinese Office Action dated Jan. 30, 2019, issued in a counterpart Chinese application No. 201610392676.9.

*Primary Examiner* — Henry Tsai
*Assistant Examiner* — Aurangzeb Hassan
(74) *Attorney, Agent, or Firm* — Jefferson IP Law, LLP

(57) ABSTRACT

An electronic device and method of operating the electronic device are provided. The electronic device includes a housing, a first connector configured to be exposed to outside of the housing and include a first number of pins, a second connector configured to be exposed to the outside of the housing and include a second number of pins, and a circuit configured to provide an electrical connection between the first number of pins and the second number of pins, wherein the first number is different from the second number, and wherein, when the first connector is connected with a first external electronic device and the second connector is connected with a second external electronic device, the circuit is configured to receive analog identification (ID) information through at least one pin among the first number of pins, and generate digital ID information at least partially based on the analog ID information so as to provide the digital ID information to at least one of the second number of pins.

14 Claims, 20 Drawing Sheets

(51) Int. Cl.
*H01R 31/06* (2006.01)
*G06F 1/26* (2006.01)
*H01R 24/64* (2011.01)
*H03M 1/12* (2006.01)
*H01R 24/60* (2011.01)
*H04N 21/414* (2011.01)
*H04N 21/4363* (2011.01)
*H04N 21/4402* (2011.01)
*H01R 107/00* (2006.01)

(52) U.S. Cl.
CPC ............. *H01R 24/60* (2013.01); *H01R 24/64* (2013.01); *H01R 31/065* (2013.01); *H03M 1/12* (2013.01); *H04N 21/41407* (2013.01); *H04N 21/43632* (2013.01); *H04N 21/43637* (2013.01); *H04N 21/440218* (2013.01); *H01R 2107/00* (2013.01)

(56) References Cited

U.S. PATENT DOCUMENTS

| | | | |
|---|---|---|---|
| 8,064,613 | B1 | 11/2011 | Helfrich |
| 2004/0064273 | A1* | 4/2004 | Le .......................... G06F 1/266 702/60 |
| 2007/0232098 | A1 | 10/2007 | Danner |
| 2010/0109795 | A1 | 5/2010 | Jones et al. |
| 2010/0169534 | A1 | 7/2010 | Saarinen et al. |
| 2011/0191814 | A1 | 8/2011 | Kobayashi |
| 2011/0219272 | A1* | 9/2011 | Lai ......................... G06F 13/00 714/54 |
| 2012/0290761 | A1* | 11/2012 | Chen .................. G06F 13/4045 710/305 |
| 2013/0084725 | A1* | 4/2013 | Liao ....................... H01R 31/06 439/170 |
| 2013/0323951 | A1 | 12/2013 | Yu et al. |
| 2014/0057495 | A1* | 2/2014 | Liao ................... H01R 13/4538 439/660 |
| 2014/0073188 | A1 | 3/2014 | Fritchman et al. |
| 2014/0354080 | A1 | 12/2014 | Sung et al. |
| 2015/0031223 | A1* | 1/2015 | Liao ....................... H01R 13/44 439/136 |
| 2015/0186320 | A1* | 7/2015 | Jaussi ................. G06F 13/4068 710/305 |
| 2015/0269102 | A1* | 9/2015 | Inha ..................... G06F 13/385 710/14 |
| 2015/0296645 | A1* | 10/2015 | Sam ...................... G06F 1/1632 361/679.32 |
| 2016/0093994 | A1* | 3/2016 | Chen ................... H01R 12/724 439/607.01 |
| 2016/0239075 | A1* | 8/2016 | Miyaoka ................. G06F 1/26 |
| 2016/0259005 | A1* | 9/2016 | Menon ............... G01R 31/3177 |
| 2016/0323435 | A1* | 11/2016 | Antonopoulos .. H04M 1/72527 |
| 2017/0040761 | A1* | 2/2017 | Tsai ..................... H01R 13/642 |

FOREIGN PATENT DOCUMENTS

| | | |
|---|---|---|
| CN | 101882736 A | 11/2010 |
| CN | 102203851 A | 9/2011 |
| CN | 203135171 U | 8/2013 |
| CN | 204179445 U | 2/2015 |
| KR | 10-2006-0068603 A | 6/2006 |

\* cited by examiner

METHOD AND APPARATUS FOR PROVIDING INTERFACE

CROSS-REFERENCE TO RELATED APPLICATION(S)

This application claims the benefit under 35 U.S.C. § 119(a) of a Korean patent application filed on Jun. 10, 2015 in the Korean Intellectual Property Office and assigned Serial number 10-2015-0082043, the entire disclosure of which is hereby incorporated by reference.

TECHNICAL FIELD

The present disclosure relates to a method and apparatus for providing an interface in order to provide compatibility between a legacy system and an electronic device.

BACKGROUND

With the recent development of digital technologies, various types of electronic devices such as a mobile communication terminal, a smart phone, a tablet personal computer (PC), a personal digital assistant (PDA), an electronic note, a notebook, a wearable device, and a television (TV) are widely used. The electronic devices as described above provide various interfaces for data transmission, and support data communication (for example, transmission or reception) between electronic devices in a wired scheme or a wireless scheme corresponding to interfaces established between the electronic devices. For example, the electronic device may provide an interface through which data can be exchanged in a wireless scheme based on short-rage communication such as Bluetooth, or near field communication (NFC) and an interface through which data can be exchanged in a wired scheme based on a cable such as a universal serial bus (USB).

The interface of the wireless scheme has an advantage of not requiring a physical cable connection, but is not universal compared to the wired scheme since the wireless scheme has a limitation in a data transmission rate and there are still electronic devices which do not support the wireless communication. Therefore, in the electronic device, a scheme for physically connecting to and transferring data to other electronic devices based on the wired interface scheme (for example, a USB interface) has been most widely used.

For the case of a USB interface, USB 3.1 type-C standard interface (hereinafter, USB Type-C interface) has recently been proposed and commercialized. The USB Type-C interface has a symmetrical structure, and can be connected regardless of the directivity, when connecting USB interfaces (for example, USB connectors) of an electronic device through a USB cable. For example, since connectors at both ends of the USB cable have the same shape (form) and the connector does not distinguish between top and bottom, the immediate connection is possible without the need to match pin directivity of the connector.

The above information is presented as background information only to assist with an understanding of the present disclosure. No determination has been made, and no assertion is made, as to whether any of the above might be applicable as prior art with regard to the present disclosure.

SUMMARY

The direct connection is not possible between an electronic device employed with a universal serial bus (USB) interface (for example, a legacy system (for example, USB 2.0 accessories such as widely used on-the-go (OTG), data cable, wall charger, etc.) in which a USB 2.0 standard pin-out interface such as Micro A, B, AB, etc. is employed) and an electronic device in which a USB Type-C interface is employed due to the difference in the pin configuration, shape (form), etc. of the USB interface according to the related art. Currently, a gender has been used for the connection between the USB Type-C interface (for example, a high level interface standard) and the USB 2.0 interface (for example, a low level interface standard). However, according to the USB Type-C interface, it is defined that all data connections and controls are to be performed by transmitting and receiving a digital signal to and from a CC1 pin (terminal) and CC2 pin. Therefore, even when the gender is used, the USB identification (ID), which is a form of an analog signal of a device (for example, a legacy system) supporting the USB 2.0 interface, may not be recognized, according to the related art.

Aspects of the present disclosure are to address at least the above-mentioned problems and/or disadvantages and to provide at least the advantages described below. Accordingly, an aspect of the present disclosure is to provide a method and apparatus for providing compatibility between a device having a high level interface standard and a device having a low level interface standard.

Another aspect of the present disclosure is to provide a method and apparatus for ensuring the compatibility between an electronic device to which a USB Type-C is applied and a legacy system supporting the USB 2.0 interface which is currently commonly used in various ways.

Another aspect of the present disclosure is to provide a method and apparatus for supporting data communication and various functions through a conversion circuit capable of recognizing the USB ID, when connecting a legacy system to an electronic device to which an USB Type-C interface is applied.

Another aspect of the present disclosure is to provide a method and apparatus for enabling an electronic device to be compatible with the legacy systems without changing the manufacturing process equipment according to the related art, when applying a USB Type-C, by integrating, through a virtual bus (VBUS) terminal, the charging and the system power path for the process-use system power to maintain all features of a standard pin-out and power delivery (PD).

In accordance with an aspect of the present disclosure, an electronic device is provided. The electronic device includes a housing, a first connector configured to be exposed to outside of the housing and include a first number of pins, a second connector configured to be exposed to the outside of the housing and include a second number of pins, and a circuit configured to provide an electrical connection between the first number of pins and the second number of pins, wherein the first number is different from the second number, and wherein, when the first connector is connected with a first external electronic device and the second connector is connected with a second external electronic device, the circuit is further configured to receive analog ID information through at least one pin among the first number of pins, and generate digital ID information at least partially based on the analog ID information so as to provide the digital ID information to at least one of the second number of pins.

In accordance with another aspect of the present disclosure, an electronic device is provided. The electronic device includes a housing; a first connector configured to be exposed to the outside of the housing and include a first number of pins; a second connector configured to be exposed to the outside of the housing and include a second number of pins; and a circuit configured to provide an electrical connection between the first number of pins and the second number of pins, wherein the first number is different from the second number, and when the first connector is connected with a first external electronic device and the second connector is connected with a second external electronic device, the circuit is configured to: acquire, from a first external device, at least one among analog ID information, data information, or power information associated with the external device for the electronic device; convert the analog ID information into digital ID information; and provide the data information or the power information through the first path and provide the digital ID information through the second path.

In accordance with another aspect of the present disclosure, an electronic device is provided. The electronic device includes a connector configured to connect the electronic device with an external device, an electrical path configured to be electrically connected to the connector, a processor configured to be electrically connected to the connector and the electrical path, and a memory configured to be electrically connected to the processor, wherein the memory is configured to store instructions to be executed by the processor, the instructions comprising transmitting analog ID information received through at least one pin of the connector through the electrical path, generating digital ID information on the basis of the transmitted analog ID information, and determining information to be transmitted to the external device on the basis of the generated digital ID information.

In accordance with another aspect of the present disclosure, an electronic device is provided. The electronic device includes a housing; a first connector configured to be exposed to the outside of the housing and include a first number of pins; a second number of electrical paths configured to be included inside the housing; the processor configured to be electrically connected to at least some of the electrical paths; and a circuit configured to provide an electrical connection between the first number of pins and the second number of electrical paths, wherein the first number is different from the second number, and when the first connector is connected with a first external electronic device, the circuit is configured to: receive analog ID information through at least one pin among the first number of pins, and generate digital ID information at least partially based on the analog ID information so as to provide the digital ID information to at least one of the second number of electrical paths.

In accordance with another aspect of the present disclosure, a method for operating an electronic device including a first connector and second connector is provided. The method includes detecting the connection of external electronic devices through the first connector and the second connector, receiving analog ID information through at least one of the first number of pins of the first connector, generating digital ID information at least partially based on the analog ID information, and providing the generated digital ID information to at least one of the second number of pins of the second connector, wherein the first number is different from the second number.

In accordance with another aspect of the present disclosure, a method for operating an electronic device having a connector is provided. The method includes connecting to an external device through the connector, receiving analog ID information associated with the external device through at least one pin of the connector, transmitting the received ID information through the electrical path electrically connected to the connector, generating digital ID information based on the transmitted analog ID information, and determining information to be transmitted to the external device based on the generated digital ID information.

In order to solve the technical problem, various embodiments of the present disclosure may include a computer-readable recording medium having a program recorded therein to perform the method by a processor.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, like reference numerals will be understood to refer to like parts, components, and structures.

DETAILED DESCRIPTION

Figure 1:
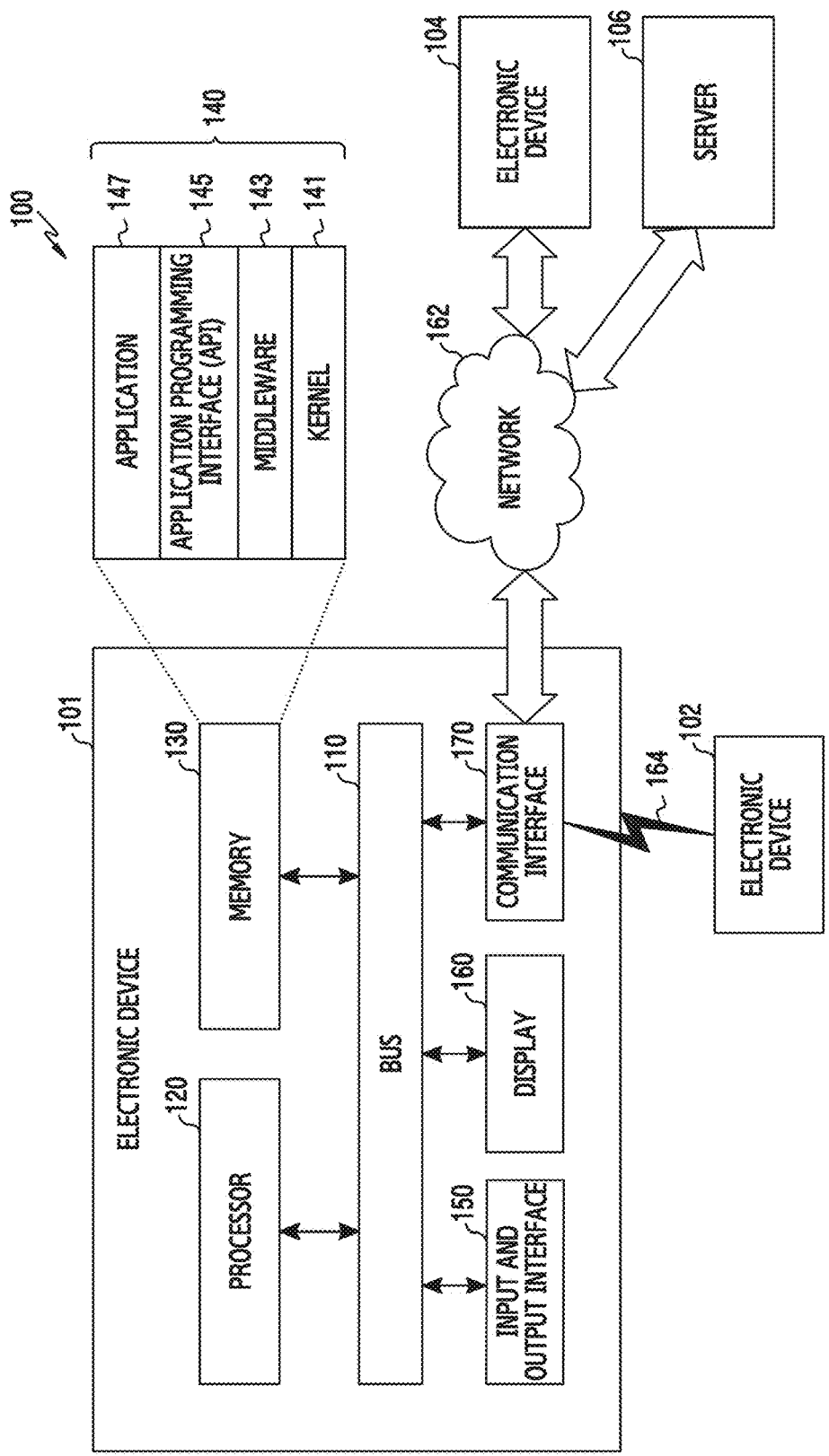
FIG. 1 illustrates a network environment including an electronic device according to various embodiments of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

As used herein, the expression "have", "may have", "include", or "may include" refers to the existence of a corresponding feature (e.g., numeral, function, operation, or constituent element such as component), and does not exclude one or more additional features.

In the present disclosure, the expression "A or B", "at least one of A or/and B", or "one or more of A or/and B" may include all possible combinations of the items listed. For example, the expression "A or B", "at least one of A and B", or "at least one of A or B" refers to all of (1) including at least one A, (2) including at least one B, or (3) including all of at least one A and at least one B.

The expression "a first", "a second", "the first", or "the second" used in various embodiments of the present disclosure may modify various components regardless of the order and/or the importance but does not limit the corresponding components. For example, a first user device and a second user device indicate different user devices although both of them are user devices. For example, a first element may be termed a second element, and similarly, a second element may be termed a first element without departing from the scope of the present disclosure.

It should be understood that when an element (e.g., first element) is referred to as being (operatively or communicatively) "connected," or "coupled," to another element (e.g., second element), it may be directly connected or coupled directly to the other element or any other element (e.g., third element) may be interposer between them. In contrast, it may be understood that when an element (e.g., first element) is referred to as being "directly connected," or "directly coupled" to another element (second element), there are no element (e.g., third element) interposed between them.

The expression "configured to" used in the present disclosure may be exchanged with, for example, "suitable for", "having the capacity to", "designed to", "adapted to", "made to", or "capable of" according to the situation. The term "configured to" may not necessarily imply "specifically designed to" in hardware. Alternatively, in some situations, the expression "device configured to" may mean that the device, together with other devices or components, "is able to". For example, the phrase "processor adapted (or configured) to perform A, B, and C" may mean a dedicated processor (e.g. embedded processor) only for performing the corresponding operations or a generic-purpose processor (e.g., central processing unit (CPU) or application processor (AP)) that can perform the corresponding operations by executing one or more software programs stored in a memory device.

Unless defined otherwise, all terms used herein, including technical and scientific terms, have the same meaning as those commonly understood by a person skilled in the art to which the present disclosure pertains. Such terms as those defined in a generally used dictionary may be interpreted to have the meanings equal to the contextual meanings in the relevant field of art, and are not to be interpreted to have ideal or excessively formal meanings unless clearly defined in the present disclosure. in some cases, even the term defined in the present disclosure should not be interpreted to exclude embodiments of the present disclosure.

An electronic device according to various embodiments of the present disclosure may include at least one of for example, a smart phone, a tablet personal computer (PC), a mobile phone, a video phone, an electronic book reader (e-book reader), a desktop PC, a laptop PC, a netbook computer, a workstation, a server, a personal digital assistant (PDA), a portable multimedia player (PMP), a Moving Picture Experts Group phase 1 or phase 2 (MPEG-1 or MPEG-2) audio layer-III (MP3) player, a mobile medical device, a camera, and a wearable device. According to various embodiments of the present disclosure, the wearable device may include at least one of an accessory type (e.g., a watch, a ring, a bracelet, an anklet, a necklace, a glasses, a contact lens, or a head-mounted device (HMD)), a fabric or clothing integrated type (e.g., an electronic clothing), a body-mounted type (e.g., a skin pad, or tattoo), and a bio-implantable type (e.g., an implantable circuit).

According to some embodiments of the present disclosure, the electronic device may be a home appliance. The home appliance may include at least one of, for example, a television (TV), a digital versatile disc (DVD) player, an audio, a refrigerator, an air conditioner, a vacuum cleaner, an oven, a microwave oven, a washing machine, an air cleaner, a set-top box, a home automation control panel, a security control panel, a TV box (e.g., Samsung HomeSync™, Apple TV™, or Google TV™), a game console (e.g., Xbox™ and PlayStation™), an electronic dictionary, an electronic key, a camcorder, and an electronic photo frame.

According to another embodiment of the present disclosure, the electronic device may include at least one of various medical devices (e.g., various portable medical measuring devices (a blood glucose monitoring device, a heart rate monitoring device, a blood pressure measuring device, a body temperature measuring device, etc.), a magnetic resonance angiography (MRA), a magnetic resonance imaging (MRI), a computed tomography (CT) machine, and an ultrasonic machine), a navigation device, a global positioning system (GPS) receiver, an event data recorder (EDR), a flight data recorder (FDR), a vehicle infotainment device, an electronic device for a ship (e.g., a navigation device for a ship, and a gyro-compass), avionics, security devices, an automotive head unit, a robot for home or industry, an automatic teller machine (ATM) in banks, point of sales (POS) in a shop, or internet of things device (e.g., a light bulb, various sensors, electric or gas meter, a sprinkler device, a fire alarm, a thermostat, a streetlamp, a toaster, a sporting goods, a hot water tank, a heater, a boiler, etc.).

According to some embodiments of the present disclosure, the electronic device may include at least one of a part of furniture or a building/structure, an electronic board, an electronic signature receiving device, a projector, and various kinds of measuring instruments (e.g., a water meter, an electric meter, a gas meter, and a radio wave meter). The electronic device according to various embodiments of the present disclosure may be a combination of one or more of the aforementioned various devices. The electronic device according to some embodiments of the present disclosure may be a flexible device. Further, the electronic device according to an embodiment of the present disclosure is not limited to the aforementioned devices, and may include a new electronic device according to the development of technology.

Hereinafter, an electronic device according to various embodiments will be described with reference to the accompanying drawings. As used herein, the term "user" may indicate a person who uses an electronic device or a device (e.g., an artificial intelligence electronic device) that uses an electronic device.

FIG. 1 illustrates a network environment including an electronic device according to various embodiments of the present disclosure.

An electronic device 101 within a network environment 100, according to various embodiments of the present disclosure, will be described with reference to FIG. 1. The electronic device 101 may include a bus 110, a processor 120, a memory 130, an input/output interface 150, a display 160, and a communication interface 170. According to an embodiment of the present disclosure, the electronic device 101 may omit at least one of the above components or may further include other components.

The bus 110 may include, for example, a circuit which interconnects the components comprising the bus 110, the processor 120, the memory 130, the input/output interface 150, the display 160, and the communication interface 170 and delivers a communication (e.g., a control message and/or data) between the components.

The processor 120 may include one or more of a CPU, an AP, and a communication processor (CP). The processor 120 may carry out, for example, calculation or data processing relating to control and/or communication of at least one other component of the electronic device 101.

The memory 130 may include a volatile memory and/or a non-volatile memory. The memory 130 may store, for example, commands or data relevant to at least one other component of the electronic device 101. According to an embodiment of the present disclosure, the memory 130 may store software and/or a program 140. The program 140 may include, for example, a kernel 141, middleware 143, an application programming interface (API) 145, and/or application programs (or "applications") 147. At least some of the kernel 141, the middleware 143, and the API 145 may be referred to as an operating system (OS).

The kernel 141 may control or manage system resources e.g., the bus 110, the processor 120, or the memory 130) used for performing an operation or function implemented in the other programs (e.g., the middleware 143, the API 145, or the application programs 147). Furthermore, the kernel 141 may provide an interface through which the middleware 143, the API 145, or the application programs 147 may access the individual components of the electronic device 101 to control or manage the system resources.

The middleware 143, for example, may serve as an intermediary for allowing the API 145 or the application programs 147 to communicate with the kernel 141 to exchange data.

Also, the middleware 143 may process one or more task requests received from the application programs 147 according to priorities thereof. For example, the middleware 143 may assign priorities for using the system resources (e.g., the bus 110, the processor 120, the memory 130, or the like) of the electronic device 101, to at least one of the application programs 147. For example, the middleware 143 may perform scheduling or loading balancing on the one or more task requests by processing the one or more task requests according to the priorities assigned thereto.

The API 145 is an interface through which the application programs 147 control functions provided from the kernel 141 or the middleware 143, and may include, for example, at least one interface or function (e.g., instruction) for file control, window control, image processing, character control, and the like.

The input/output interface 150, for example, may function as an interface that may transfer commands or data input from a user or another external device to the other element(s) of the electronic device 101. Furthermore, the input/output interface 150 may output the commands or data received from the other element(s) of the electronic device 101 to the user or another external device.

Examples of the display 160 may include a liquid crystal display (LCD), a light-emitting diode (LED) display, an organic LED (OLED) display, a microelectromechanical Systems (MEMS) display, and an electronic paper display. The display 160 may display, for example, various types of contents (e.g., text, images, videos, icons, or symbols) to users. The display 160 may include a touch screen, and may receive, for example, a touch, gesture, proximity, or hovering input using an electronic pen or a user's body part.

The communication interface 170 may establish communication, for example, between the electronic device 101 and an external device (e.g., a first external electronic device 102, a second external electronic device 104, or a server 106). For example, the communication interface 170 may be connected to a network 162 through wireless or wired communication, and may communicate with an external device (e.g., the second external electronic device 104 or the server 106). The wireless communication may use at least one of, for example, long term evolution (LTE), LTE-advanced (LTE-A), code division multiple access (CDMA), wideband CDMA (WCDMA), universal mobile telecommunications system (UMTS), wireless broadband (WiBro), and global system for mobile communications (GSM), as a cellular communication protocol. In addition, the wireless communication may include, for example, short range communication 164. The short-range communication 164 may include at least one of for example, Wi-Fi, Bluetooth, near field communication (NFC), and global navigation satellite system (GNSS). GNSS may include, for example, at least one of GPS, global navigation satellite system (GLONASS), Beidou navigation satellite system (Beidou) or Galileo, and the European global satellite-based navigation system, based on a location, a bandwidth, or the like. Hereinafter, in the present disclosure, the "GPS" may be interchangeably used with the "GNSS". The wired communication may include, for example, at least one of a universal serial bus (USB), a high definition multimedia interface (HDMI), recommended standard 232 (RS-232), and a plain old telephone service (POTS). The network 162 may include at least one of a telecommunication network such as a computer network (e.g., a local area network (LAN) or a wireless area network (WAN)), the Internet, and a telephone network.

Each of the first and second external electronic devices 102 and 104 may be of a type identical to or different from that of the electronic device 101. According to an embodiment of the present disclosure, the server 106 may include a group of one or more servers.

According to various embodiments of the present disclosure, all or some of the operations performed in the electronic device 101 may be executed in another electronic device or a plurality of electronic devices (e.g., the electronic devices 102 and 104 or the server 106). According to an embodiment of the present disclosure, when the electronic device 101 has to perform some functions or services automatically or in response to a request, the electronic device 101 may request another device (e.g., the electronic device 102 or 104 or the server 106) to execute at least some functions relating thereto instead of or in addition to autonomously performing the functions or services. Another electronic device (e.g., the electronic device 102 or 104, or the server 106) may execute the requested functions or the additional functions, and may deliver a result of the execution to the electronic device 101. The electronic device 101 may process the received result as it is or additionally, and may provide the requested functions or services. To this end, for example, cloud computing, distributed computing, or client-server computing technologies may be used.

Figure 2:
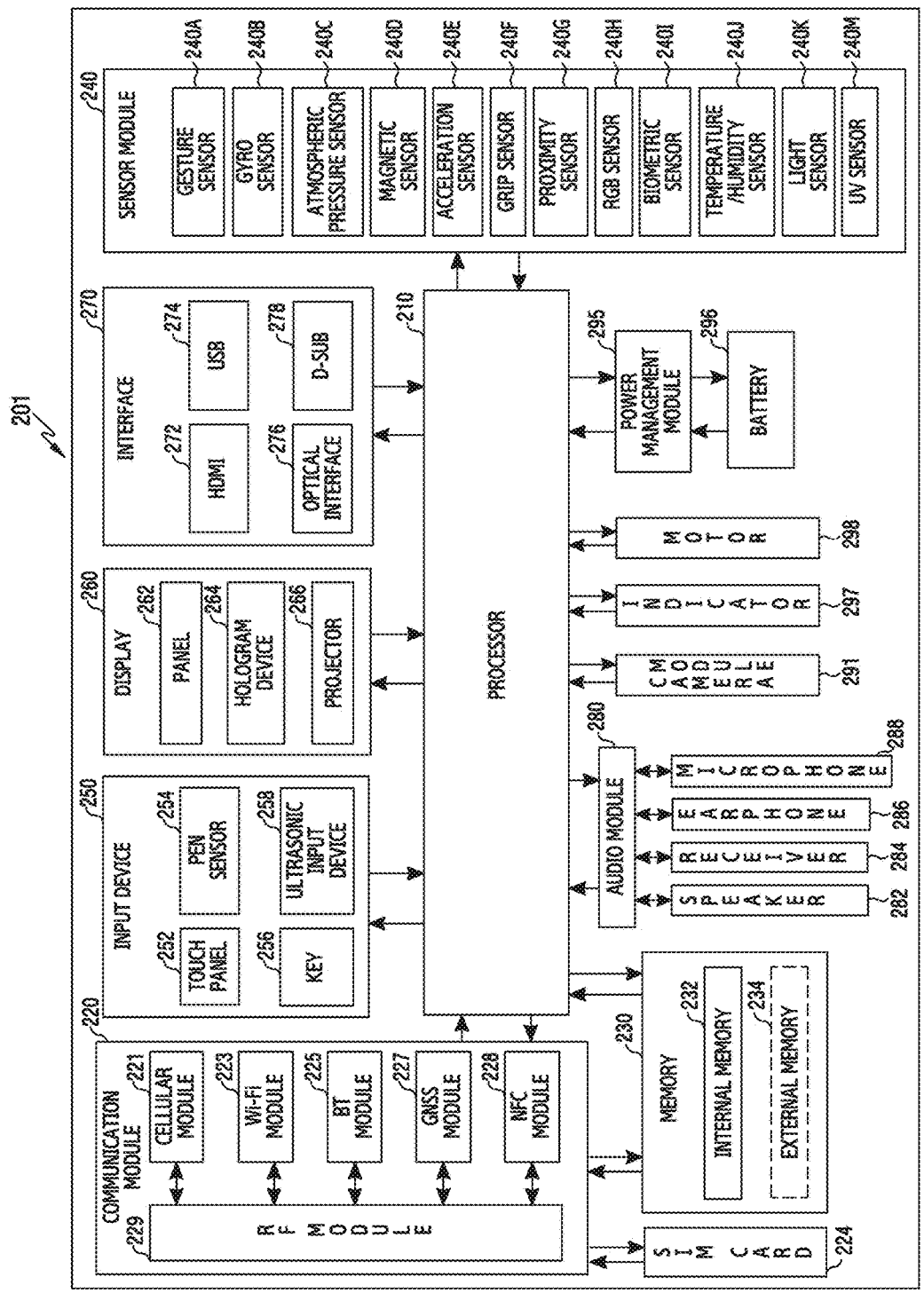
FIG. 2 is a block diagram of an electronic device according to various embodiments of the present disclosure.

FIG. 2 is a block diagram of an electronic device according to various embodiments of the present disclosure.

The electronic device 201 may include, for example, all or a part of the electronic device 101 shown in FIG. 1. The electronic device 201 may include one or more processors 210 (e.g., AP), a communication module 220, a subscriber identification module (SIM) 224, a memory 230, a sensor module 240, an input device 250, a display 260, an interface 270, an audio module 280, a camera module 291, a power management module 295, a battery 296, an indicator 297, and a motor 298.

The processor 210 may control a plurality of hardware or software components connected to the processor 210 by driving an operating system or an application program, and perform processing of various pieces of data and calculations. The processor 210 may be embodied as, for example, a system on chip (SoC). According to an embodiment of the present disclosure, the processor 210 may further include a graphics processing unit (GPU) and/or an image signal processor (ISP). The processor 210 may include at least some (for example, a cellular module 221) of the components illustrated in FIG. 2. The processor 210 may load, into a volatile memory, commands or data received from at least one (e.g., a non-volatile memory) of the other components and may process the loaded commands or data, and may store various data in a non-volatile memory.

The communication module 220 may have a configuration equal or similar to that of the communication interface 170 of FIG. 1. The communication module 220 may include, for example, a cellular module 221, a Wi-Fi module 223, a BT module 225, a GNSS module 227 (e.g., a GPS module 227, a GLONASS module, a Beidou module, or a Galileo module), an NFC module 228, and a radio frequency (RF) module 229.

The cellular module 221, for example, may provide a voice call, a video call, a text message service, or an Internet service through a communication network. According to an embodiment of the present disclosure, the cellular module 221 may distinguish and authenticate the electronic device 201 in a communication network using the SIM 224 (for example, the SIM card). According to an embodiment of the present disclosure, the cellular module 221 may perform at least some of the functions that the processor 210 may provide. According to an embodiment of the present disclosure, the cellular module 221 may include a CP.

For example, each of the Wi-Fi module 223, the BT module 225, the GNSS module 227, and the NFC module 228 may include a processor for processing data transmitted/received through a corresponding module. According to an embodiment of the present disclosure, at least some (e.g., two or more) of the cellular module 221, the Wi-Fi module 223, the BT module 225, the GNSS module 227, and the NFC module 228 may be included in one integrated chip (IC) or IC package.

The RF module 229, for example, may transmit/receive a communication signal (e.g., an RF signal). The RF module 229 may include, for example, a transceiver, a power amplifier module (PAM), a frequency filter, a low noise amplifier (LNA), and an antenna. According to another embodiment of the present disclosure, at least one of the cellular module 221, the module 223, the BT module 225, the GNSS module 227, and the NEC module 228 may transmit/receive an RF signal through a separate RF module.

The SIM 224 may include, for example, a card including a SIM and/or an embedded SIM, and may contain unique identification (ID) information (e.g., an integrated circuit card identifier (ICCID)) or subscriber information (e.g., an international mobile subscriber identity (IMSI).

The memory 230 (e.g., the memory 130) may include, for example, an embedded memory 232 or an external memory 234. The embedded memory 232 may include at least one of a volatile memory (e.g., a dynamic random access memory (DRAM), a static RAM (SRAM), a synchronous dynamic RAM (SDRAM), and the like) and a non-volatile memory (e.g., a one time programmable read only memory (OTPROM), a programmable ROM (PROM), an erasable and programmable ROM (EPROM), an electrically erasable and programmable ROM (EEPROM), a mask ROM, a flash ROM, a flash memory (e.g., a NAND flash memory or a NOR flash memory), a hard disc drive, a solid state drive (SSD), and the like).

The external memory 234 may further include a flash drive, for example, a compact flash (CF), a secure digital (SD), a micro-SD, a mini-SD, an eXtreme digital (xD), a multimedia card (MMC), a memory stick, or the like. The external memory 234 may be functionally and/or physically connected to the electronic device 201 through various interfaces.

The sensor module 240, for example, may measure a physical quantity or detect an operation state of the electronic device 201, and may convert the measured or detected information into an electrical signal. The sensor module 240 may include, for example, at least one of a gesture sensor 240A, a gyro sensor 240B, an atmospheric pressure sensor (barometer) 240C, a magnetic sensor 240D, an acceleration sensor 240E, a grip sensor 240F, a proximity sensor 240G, a color sensor 240H (e.g., red, green, and blue (RGB) sensor), a biometric sensor (medical sensor) 240I, a temperature/humidity sensor 240J, an illuminance sensor 240K, and an ultra violet (UV) sensor 240M. Additionally or alternatively, the sensor module 240 may include, for example, an E-nose sensor, an electromyography (EMG) sensor, an electroencephalogram (EEG) sensor, an electrocardiogram (ECG) sensor, an infrared (IR) sensor, an iris scan sensor, and/or a finger scan sensor. The sensor module 240 may further include a control circuit for controlling one or more sensors included therein.

According to an embodiment of the present disclosure, the electronic device 201 may further include a processor configured to control the sensor module 240, as a part of the processor 210 or separately from the processor 210, and may control the sensor module 240 while the processor 210 is in a sleep state.

The input device 250 may include, for example, a touch panel 252, a (digital) pen sensor 254, a key 256, or an ultrasonic input device 258. The touch panel 252 may use, for example, at least one of a capacitive type, a resistive type, an infrared type, and an ultrasonic type. The touch panel 252 may further include a control circuit. The touch panel 252 may further include a tactile layer, and provide a tactile reaction to the user.

The (digital) pen sensor 254 may include, for example, a recognition sheet which is a part of the touch panel or is separated from the touch panel. The key 256 may include, for example, a physical button, an optical key or a keypad. The ultrasonic input device 258 may detect, through a microphone e.g., microphone 288), ultrasonic waves generated by an input tool, and identify data corresponding to the detected ultrasonic waves.

The display 260 (e.g., the display 160) may include a panel 262, a hologram device 264, or a projector 266. The panel 262 may include a configuration identical or similar to the display 160 illustrated in FIG. 1. The panel 262 may be implemented to be, for example, flexible, transparent, or wearable. The panel 262 may be embodied as a single module with the touch panel 252. The hologram device 264 may show a three dimensional (3D) image in the air by using an interference of light. The projector 266 may project light onto a screen to display an image. The screen may be located, for example, in the interior of or on the exterior of the electronic device 201.

According to an embodiment of the present disclosure, the display 260 may further include a control circuit for controlling the panel 262, the hologram device 264, or the projector 266.

The interface 270 may include, for example, an HDMI 272, a USB 274, an optical interface 276, or a D-subminiature (D-sub) 278. The interface 270 may be included in, for example, the communication interface 170 illustrated in FIG. 1. Additionally or alternatively, the interface 270 may include, for example, a mobile high-definition link (MHL) interface, a SD card/MMC interface, or an infrared data association (IrDA) standard interface.

The audio module 280, for example, may bilaterally convert a sound and an electrical signal. At least some components of the audio module 280 may be included in, for example, the input/output interface 150 illustrated in FIG. 1. The audio module 280 may process voice information input or output through, for example, a speaker 282, a receiver 284, earphones 286, or the microphone 288.

The camera module 291 is, for example, a device which may photograph a still image and a video. According to an embodiment of the present disclosure, the camera module 291 may include one or more image sensors (e.g., a front sensor or a back sensor), a lens, an ISP or a flash (e.g., LED or xenon lamp).

The power management module 295 may manage, for example, power of the electronic device 201. According to an embodiment of the present disclosure, the power management module 295 may include a power management integrated circuit (PMIC), a charger integrated circuit (IC), or a battery or fuel gauge. The PMIC may use a wired and/or wireless charging method. Examples of the wireless charging method may include, for example, a magnetic resonance method, a magnetic induction method, an electromagnetic wave method, and the like. Additional circuits (e.g., a coil loop, a resonance circuit, a rectifier, etc.) for wireless charging may be further included. The battery gauge may measure, for example, a residual quantity of the battery 296, and a voltage, a current, or a temperature while charging. The battery 296 may include, for example, a rechargeable battery and/or a solar battery.

The indicator 297 may display a particular state (e.g., a booting state, a message state, a charging state, or the like) of the electronic device 201 or a part (e.g., the processor 210) of the electronic device 201. The motor 298 may convert an electrical signal into a mechanical vibration, and may generate a vibration, a haptic effect, or the like. Although not illustrated, the electronic device 201 may include a processing device (e.g., a GPU) for supporting a mobile TV. The processing device for supporting a mobile TV may process, for example, media data according to a certain standard such as digital multimedia broadcasting (DMB), digital video broadcasting (DVB), or mediaFLO™.

Each of the above-described component elements of hardware according to the present disclosure may be configured with one or more components, and the names of the corresponding component elements may vary based on the type of electronic device. In various embodiments of the present disclosure, the electronic device may include at least one of the above-described elements. Some of the above-described elements may be omitted from the electronic device, or the electronic device may further include additional elements. Also, some of the hardware components according to various embodiments may be combined into one entity, which may perform functions identical to those of the relevant components before the combination.

Figure 3:
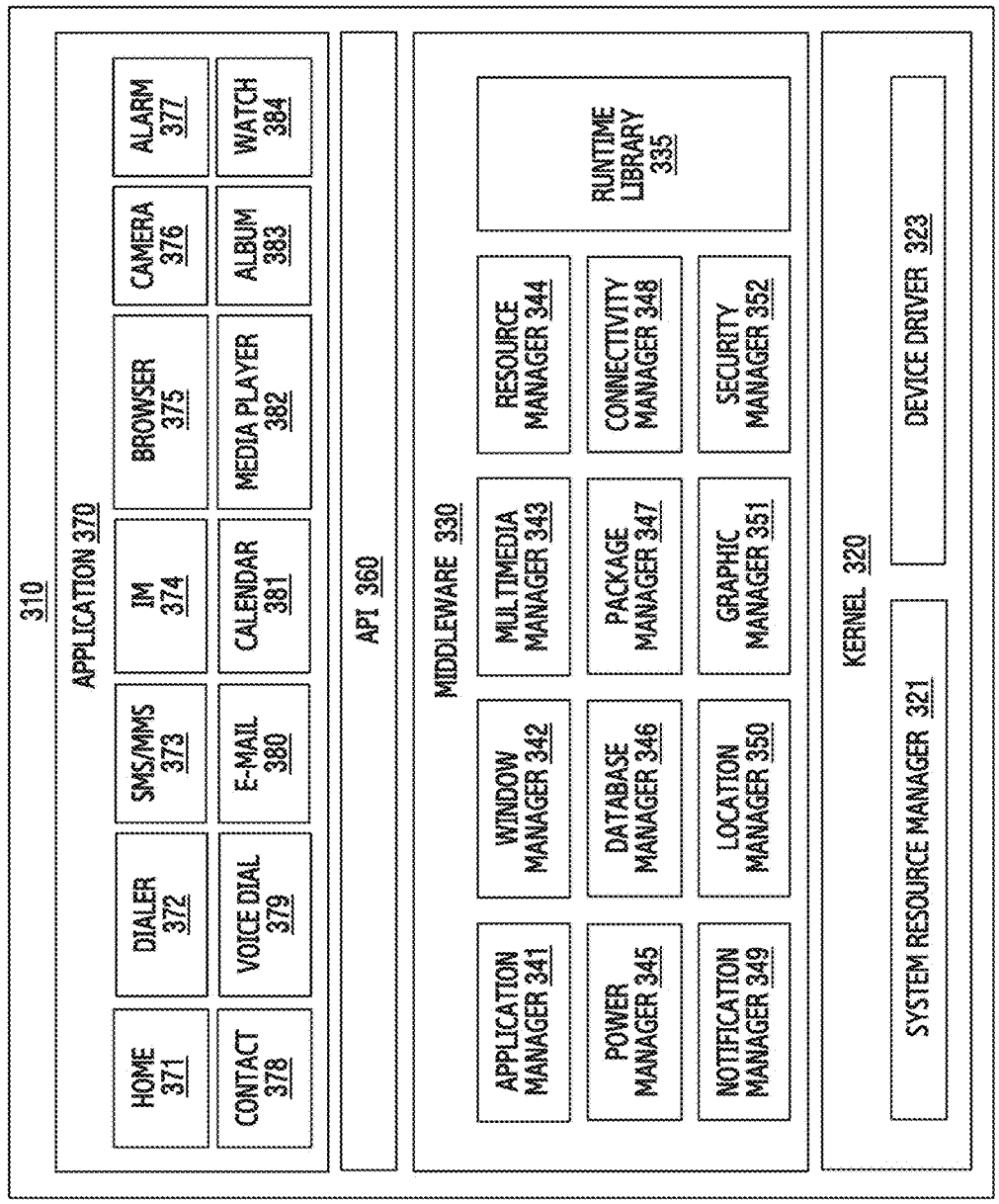
FIG. 3 is a block diagram of a program module according to various embodiments of the present disclosure.

FIG. 3 is a block diagram of a program module according to various embodiments of the present disclosure.

According to an embodiment of the present disclosure, the program module 310 (e.g., the program 140) may include an OS for controlling resources related to the electronic device (e.g., the electronic device 101) and/or various applications (e.g., the application programs 147) executed in the operating system. The operating system may be, for example, Android, iOS, Windows, Symbian, Tizen, Bada, or the like.

The program module 310 may include a kernel 320, middleware 330, an API 360, and/or applications 370. At least some of the program module 310 may be preloaded on an electronic device, or may be downloaded from an external electronic device the electronic device 102 or 104, or the server 106).

The kernel 320 (e.g., the kernel 141) may include, for example, a system resource manager 321 and/or a device driver 323. The system resource manager 321 may control, allocate, or collect system resources.

According to an embodiment of the present disclosure, the system resource manager 321 may include a process management unit, a memory management unit, a file system management unit, and the like. The device driver 323 may include, for example, a display driver, a camera driver, a Bluetooth driver, a shared memory driver, a USB driver, a keypad driver, a Wi-Fi driver, an audio driver, or an inter-process communication (IPC) driver.

For example, the middleware 330 may provide a function required in common by the applications 370, or may provide various functions to the applications 370 through the API 360 so as to enable the applications 370 to efficiently use the limited system resources in the electronic device.

According to an embodiment of the present disclosure, the middleware 330 (e.g., the middleware 143) may include at least one of a run time library 335, an application manager 341, a window manager 342, a multimedia manager 343, a resource manager 344, a power manager 345, a database manager 346, a package manager 347, a connectivity manager 348, a notification manager 349, a location manager 350, a graphic manager 351, and a security manager 352.

The runtime library 335 may include a library module that a compiler uses in order to add a new function through a programming language while an application 370 is being executed. The runtime library 335 may perform input/output management, memory management, the functionality for an arithmetic function, or the like.

The application manager 341 may manage, for example, a life cycle of at least one of the applications 370. The window manager 342 may manage graphical user interface (GUI) resources used by a screen. The multimedia manager 343 may recognize a format required for reproduction of various media files, and may perform encoding or decoding of a media file by using a codec suitable for the corresponding format. The resource manager 344 may manage resources of a source code, a memory, and a storage space of at least one of the applications 370.

The power manager 345 may operate together with, for example, a basic input/output system (BIOS) or the like to manage a battery or power source and may provide power information or the like required for the operations of the electronic device. The database manager 346 may generate, search for, and/or change a database to be used by at least one of the applications 370. The package manager 347 may manage installation or an update of an application distributed in a form of a package file.

For example, the connectivity manager 348 may manage wireless connectivity such as Wi-Fi or Bluetooth. The notification manager 349 may display or notify of an event such as an arrival message, promise, proximity notification, and the like in such a way that does not disturb a user. The location manager 350 may manage location information of an electronic device. The graphic manager 351 may manage a graphic effect which will be provided to a user, or a user interface (UI) related to the graphic effect. The security manager 352 may provide all security functions required for system security, user authentication, or the like. According to an embodiment of the present disclosure, when the electronic device (e.g., the electronic device 101) has a telephone call function, the middleware 330 may further include a telephony manager for managing a voice call function or a video call function of the electronic device.

The middleware 330 may include a middleware module that forms a combination of various functions of the above-described components. The middleware 330 may provide a module specialized for each type of OS in order to provide a differentiated function. Further, the middleware 330 may dynamically remove some of the existing components or add new components.

The API 360 (e.g., the API 145) is, for example, a set of API programming functions, and may be provided with a different configuration according to an OS. For example, in the case of Android or iOS, one API set may be provided for each platform. In the case of Tizen, two or more API sets may be provided for each platform.

The applications 370 (e.g., the application programs 147) may include, for example, one or more applications which may provide functions such as a home 371, a dialer 372, a short message service (SMS)/multimedia messaging service (MMS) 373, an instant message (IM) 374, a browser 375, a camera 376, an alarm 377, contacts 378, a voice dial 379, an email 380, a calendar 381, a media player 382, an album 383, a watch (e.g., clock) 384, health care (e.g., measuring exercise quantity or blood sugar), or environment information (e.g., providing atmospheric pressure, humidity, or temperature information).

According to an embodiment of the present disclosure, the applications 370 may include an application (hereinafter, referred to as an "information exchange application" for convenience of description) that supports exchanging information between the electronic device (e.g., the electronic device 101) and an external electronic device (e.g., the electronic device 102 or 104). The information exchange application may include, for example, a notification relay application for transferring specific information to an external electronic device or a device management application for managing an external electronic device.

For example, the notification relay application may include a function of transferring, to the external electronic device (e.g., the electronic device 102 or 104), notification information generated from other applications of the electronic device 101 (e.g., an SMS/MMS application, an e-mail application, a health management application, or an environmental information application). Further, the notification relay application may receive notification information from, for example, an external electronic device and provide the received notification information to a user.

The device management application may manage (e.g., install, delete, or update), for example, at least one function of an external electronic device (e.g., the electronic device 102 or 104) communicating with the electronic device (e.g., a function of turning on/off the external electronic device itself (or some components) or a function of adjusting the brightness (or a resolution) of the display), applications operating in the external electronic device, and services provided by the external electronic device (e.g., a call service or a message service).

According to an embodiment of the present disclosure, the applications 370 may include applications (e.g., a health care application of a mobile medical appliance or the like) designated according to an external electronic device (e.g., attributes of the electronic device 102 or 104).

According to an embodiment of the present disclosure, the applications 370 may include an application received from an external electronic device (e.g., the server 106, or the electronic device 102 or 104).

According to an embodiment of the present disclosure, the applications 370 may include a preloaded application or a third party application that may be downloaded from a server. The names of the components of the program module 310 of the illustrated embodiment of the present disclosure may change according to the type of operating system.

According to various embodiments of the present disclosure, at least a part of the program module 310 may be implemented in software, firmware, hardware, or a combination of two or more thereof. At least some of the program module 310 may be implemented (e.g., executed) by, for example, the processor (e.g., the processor 1410). At least some of the program module 310 may include, for example, a module, a program, a routine, a set of instructions, and/or a process for performing one or more functions.

The term "module" as used herein may, for example, mean a unit including one of hardware, software, and firmware or a combination of two or more of them. The "module" may be interchangeably used with, for example, the term "unit", "logic", "logical block", "component", or "circuit". The "module" may be a minimum unit of an integrated component element or a part thereof. The "module" may be a minimum unit for performing one or more functions or a part thereof. The "module" may be mechanically or electronically implemented. For example, the "module" according to the present disclosure may include at least one of an application-specific integrated circuit (ASIC) chip, a field-programmable gate arrays (FPGA), and a programmable-logic device for performing operations which has been known or are to be developed hereinafter.

According to various embodiments of the present disclosure, at least some of the devices (for example, modules or functions thereof) or the method (for example, operations) according to the present disclosure may be implemented by a command stored in a computer-readable storage medium in a programming module form. The instruction, when executed by a processor (e.g., the processor 120), may cause the one or more processors to execute the function corresponding to the instruction. The computer-readable recoding media may be, for example, the memory 130.

The computer readable recoding medium may include a hard disk, a floppy disk, magnetic media (e.g., a magnetic tape), optical media (e.g., a compact disc ROM (CD-ROM) and a DVD), magneto-optical media (e.g., a floptical disk) hardware device (e.g., a ROM, a RAM, a flash memory), and the like. In addition, the program instructions may include high class language codes, which can be executed in a computer by using an interpreter, as well as machine codes made by a compiler. The aforementioned hardware device may be configured to operate as one or more software modules in order to perform the operation of the present disclosure, and vice versa.

Any of the modules or programming modules according to various embodiments of the present disclosure may include at least one of the above described elements, exclude some of the elements, or further include other additional elements. The operations performed by the modules, programming module, or other elements according to various embodiments of the present disclosure may be executed in a sequential, parallel, repetitive, or heuristic manner. Further, some operations may be executed according to another order or may be omitted, or other operations may be added.

Various embodiments disclosed herein are provided merely to easily describe technical details of the present disclosure and to help the understanding of the present disclosure, and are not intended to limit the scope of the present disclosure. Therefore, it should be construed that all modifications and changes or modified and changed forms based on the technical idea of the present disclosure fall within the scope of the present disclosure.

Various embodiments of the present disclosure relate to a method, apparatus, and system for maintaining compatibility between electronic devices supporting interfaces of different standards. In various embodiments of the present disclosure, an interface may be provided between devices supporting a USB 3.1 Type-C interface and a USB 2.0 interface, respectively. For example, according to various embodiments of the present disclosure, the compatibility may be ensured when connecting an electronic device having a high level interface standard (for example, USB 3.1 Type-C interface) and a legacy system having a low level interface standard (for example, a USB 2.0 standard pin-out interface such as Micro A, B, AB, etc.).

According to various embodiments of the present disclosure, the problem of limiting a scenario applying the legacy system can be solved, when applying a USB Type-C to an electronic device, by ensuring the compatibility of the electronic device and the USB interface-based legacy system which is commonly used in various ways according to the related art. According to various embodiments of the present disclosure, a standard pin-out may be maintained and all features of power delivery (PD) may be maintained by integrating the charging and the system power path through a VBUS terminal of a USB Type-C interface. In addition, according to various embodiments of the present disclosure, malfunction issues can be prevented between an electronic device and a legacy system, and the compatibility with the legacy system can be made without changing the manufacturing process equipment, according to the related art.

According to the various embodiments of the present disclosure, the device may include all information and communication devices, multimedia devices, wearable devices, and application devices thereof that use one or more of various processors, such as an AP, a CP, a GPU, a CPU, and the like. A legacy system according to various embodiments of the present disclosure may include legacy accessories supporting a USB 2.0 interface such as a widely used on-the-go (OTG), data cable, wall charger, PC, etc.

Hereinafter, with reference to the accompanying drawings, there will be described a method, apparatus, and system for providing an interface according to various embodiments of the present disclosure. However, since the various embodiments are not restricted or limited by the following description, it should be noted that applications can be made to the various embodiments based on embodiments that will be described below. Hereinafter, various embodiments of the present disclosure will be described based on an approach of hardware. However, various embodiments of the present disclosure include a technology that uses both hardware and software and thus, the various embodiments of the present disclosure may not exclude the perspective of software.

Figure 4:
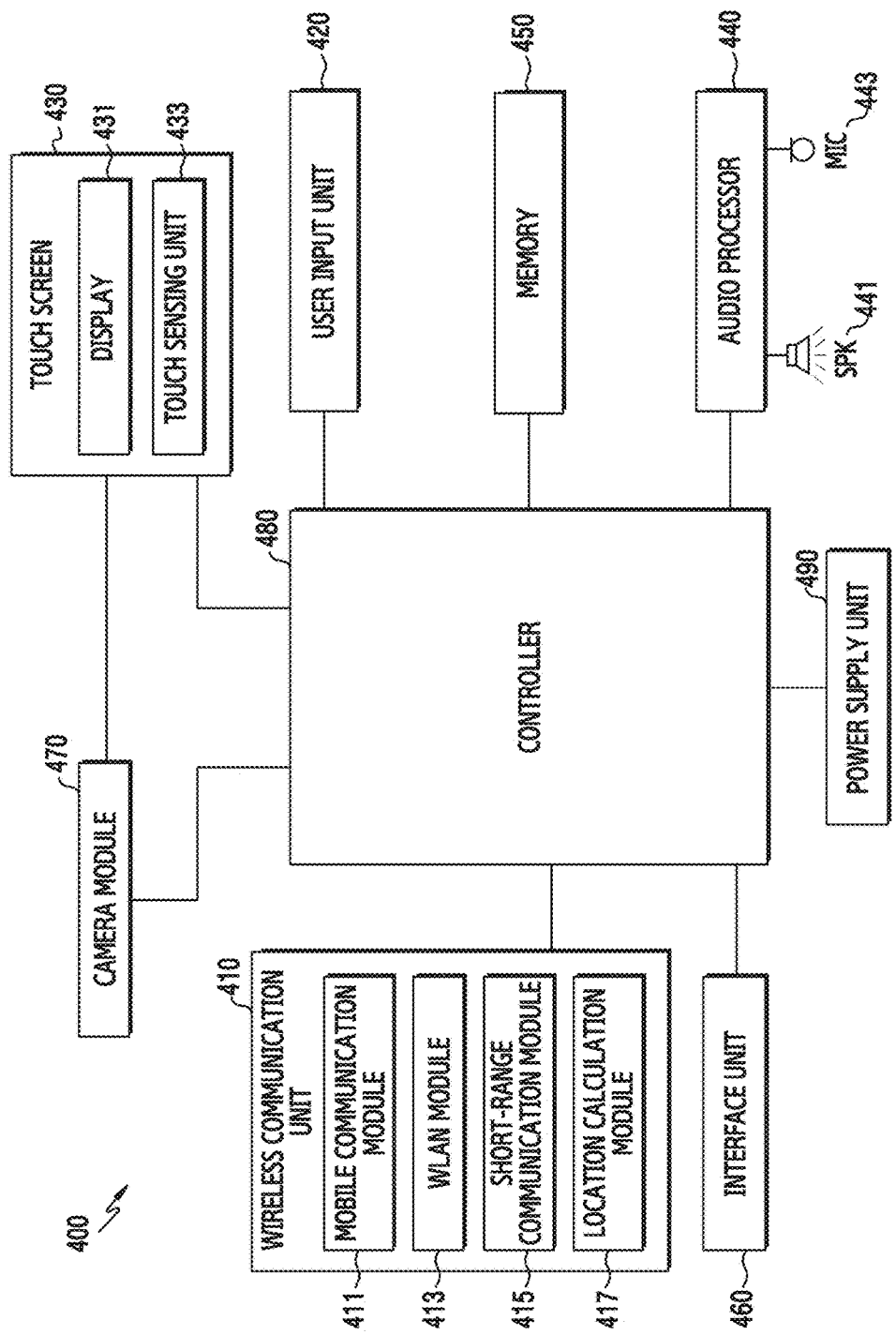
FIG. 4 is a block diagram schematically illustrating a configuration of an electronic device according to various embodiments of the present disclosure.

FIG. 4 is a block diagram schematically illustrating a configuration of an electronic device according to various embodiments of the present disclosure.

Referring to FIG. 4, an electronic device 400 according to various embodiments of the present disclosure may include a wireless communication unit 410, a user input unit 420, a touch screen 430, an audio processor 440, a memory 450, an interface unit 460, a camera module 470, a controller 480, and a power supply unit 490.

According to various embodiments of the present disclosure, the electronic device 400 may include fewer or more component elements when compared to the component elements of FIG. 4, since the component elements of FIG. 4 are not essential.

The wireless communication unit 410 may include a configuration identical or similar to the communication module 220 of FIG. 2. The wireless communication unit 410 may include one or more modules for enabling wireless communication between the electronic device 400 and other external electronic device (for example, a smartphone). For example, the wireless communication unit 410 may be configured to include a mobile communication module 411, a wireless local area network (WLAN) module 413, a short-range communication module 415, and a location calculation module 417, etc. In various embodiments of the present disclosure, the wireless communication unit 410 may include a module (for example, a short-range communication module, a telecommunication module, etc.) for performing communication with neighboring external electronic devices.

The wireless communication unit 410 may include a configuration identical or similar to the cellular module 221 of FIG. 2. The mobile communication module 411 may transmit/receive a wireless signal to/from at least one of a base station, an external electronic device (for example, the electronic device 104), and various servers (for example, an integration server, a provider server, a content server, an Internet server, a cloud server, and the like) over a mobile communication network. The wireless signal may include a voice signal, data signal, or various types of control signals. The mobile communication module 411 may transmit various pieces of data required for the operations of the electronic device 400 to the external device (e.g., the server 106, second external electronic device 104, or the like), in response to a user's request.

The WLAN module 413 may include a configuration identical or similar to the Wi-Fi module 223 of FIG. 2. The WLAN module 413 may indicate a module for establishing a wireless Internet access and a wireless LAN link with another electronic device (for example, the electronic device 102 or the server 106). The WLAN module 413 may be installed inside or outside the electronic device 400. Wireless Internet technology may include Wi-Fi, Wibro, world interoperability for microwave access (WiMax), high speed downlink packet access (HSDPA), millimeter wave (mm-Wave), or the like. The WLAN module 413 may be interlocked with another external electronic device connected to the electronic device 400 through a network (for example, Wi-Fi network), transmit/receive various pieces of data of the electronic device 400 to or from the outside (for example, an external electronic device or a server). The WLAN module 413 may always maintain an on-state, or may be turned on based on settings of the electronic device 400 or a user input.

The short-range communication module 415 may be a module for performing short-range communication. As the short-range communication technology, Bluetooth, Bluetooth low energy (BLE), RFID, IrDA communication, ultra wideband (UWB), ZigBee, or NFC, etc. can be utilized. The short-range communication module 415 may be interlocked with another electronic device connected to the electronic device 400 through a network (e.g., a short-range communication network), transmit or receive various pieces of data of the electronic device 400 to or from the electronic device 400. The short-range communication module 415 may always maintain an on-state, or may be turned on based on settings of the electronic device 400 or a user input.

The location calculation module 417 may include a configuration identical or similar to the GNSS module 227 of FIG. 2. The location calculation module 417 may be a module for obtaining the location of the electronic device 400, and may include a GPS module as a representative example. The location calculation module 417 may measure the location of the electronic device 400 through a triangulation principle.

The user input unit 420 may generate input data for controlling the operations of the electronic device 400 in response to a user input. The user input unit 420 may include at least one input device for detecting various user inputs. For example, the user input unit 420 may include a keypad, a dome switch, a physical button, a touch pad (resistive type/capacitive type), a jog & shuttle, and a sensor e.g., sensor module 240).

The user input unit 420 may be implemented in the form of buttons located outside the electronic device 400 or some or all of the user input unit 420 may be implemented in the form of touch panel. The user input unit 420 may receive a user input for initiating operations an operation of identifying a device to be connected on the basis of a USB interface and data communication operation, etc) of the electronic device 400 according to various embodiments of the present disclosure, and may generate an input signal based on a user input.

The touch screen 430 may indicate an input/output means that simultaneously executes an input function and a display function, and may include a display 431 (e.g., the display 160 or 260), and a touch sensing unit 433. The touch screen 430 may provide an input/output interface between the electronic device 400 and the user, transfer a touch input of the user to the electronic device 400, and serve as a medium that shows an output from the electronic device 400 to the user. The touch screen 430 may show a visual output to the user. The visual output may be shown in a form of text, graphics, video, and a combination thereof.

According to various embodiments of the present disclosure, the display 431 may display (output) various pieces of information processed in the electronic device 400. For example, the display 431 may display a UI or a (GUI, graphical UI) related to an operation performed by the electronic device 400 during charging or an operation of performing data communication through USB interface connection. The display 431 may use various displays (e.g., the display 160).

The touch sensing unit 433 may be mounted on the display 431, and may detect a user input that is in contact with or in proximity to the surface of the touch screen 430. The user input may include a touch event or a proximity event to be input based on at least one among a single-touch, a multi-touch, a hovering, or an air gesture. The touch sensing unit 433 may receive a user input for initiating the operations related to the use of the electronic device 400 according to various embodiments of the present disclosure, or may generate an input signal based on a user input.

The audio processor 440 may include a configuration identical or similar to the audio module 280 of FIG. 2. The audio processor 440 may transmit an audio signal received from the controller 480 to a speaker (SPK) 441, and may transfer, to the controller 480, an audio signal such as a voice or the like, which is input from a microphone (MIC) 443. The audio processor 440 may convert voice/sound data into audible sound through the speaker 441 based on the control of the controller 480 and may output the audible sound, and may convert an audio signal such as a voice or the like which is received from the microphone 443 into a digital signal and may transfer the digital signal to the controller 480.

The speaker 441 may output audio data that is received from the wireless communication unit 410 or stored in the memory 450. The speaker 441 may output a sound signal associated with various operations (functions) executed by the electronic device 400.

The microphone 443 may receive an external sound signal and process the same to be electrical voice data. Various noise reduction algorithms may be implemented in the microphone 443 to remove noise generated in the process of receiving an external sound signal. The microphone 443 may be responsible for the input of an audio stream such as voice commands (e.g., voice commands for initiating data communication).

The memory 450 (e.g., the memory 130 and 230) may store one or more programs that are executed by the controller 480, and may execute a function for temporarily storing input/output data. The input and output data may include files such as, for example, videos, images, and photographs, etc. The memory 450 may take a role for storing the acquired data, and store the data acquired in real time in a temporary storage device, and store the data decided to be stored in a long-term storage device.

The memory 450 may store one or more programs and data associated with performing functions such as connection of the electronic device 400 based on the USB interface, device ID, data communication, or charging, etc. For example, in various embodiments of the present disclosure, the memory 450 may transmit, through an electric path, analog ID information received through at least one pin of a connector, generate digital ID information based on the transmitted analog ID information, and store instructions for determining information to be transmitted to the external device based on the generated digital ID information.

The memory 450 may include one or more application modules (or a software module), etc. The application module may include instructions for the USB interface connection, device ID, data communication, or charging. For example, when a legacy system is connected through a USB Type-C interface, the application module may transmit and receive a digital signal to and from the configuration channels (CC) pin (for example, CC1, CC2) of a USB Type-C interface, and process an operation (function) of converting for identifying a device to which the legacy system is connected.

The interface unit 460 may have a configuration identical or similar to the interface 270 of FIG. 2. The interface unit 460 may receive data or power from an external electronic device, and may transfer the same to each component element included in the electronic device 400. The interface unit 460 may enable the data inside the electronic device 400 to be transmitted to an external electronic device.

For example, the interface unit 460 may include a port for connecting a device (a legacy system (e.g., USB 2.0 accessories such as widely used OTG, data cable, wall charger, etc.) in which a USB 2.0 standard pin-out interface such as Micro A, B, AB, etc. is employed)) provided with a wired/wireless headset port, an external charger port, a wired/wireless data port, a memory card port, an ID module; an audio input/output port; video input/output port; an earphone port, etc.

According to an embodiment of the present disclosure, the interface unit 460 may include a USB Type-C interface. The interface unit 460 may support the connection with another electronic device (for example, a legacy system), support communication paths (for example, a first communication path, a second communication path) according to different standards (e.g., a first standard (for example, USB 3.1) or a second standard (for example, USB 2.0)), and may support the data communication based on at least some of the communication paths. For example the interface unit 460 may simultaneously support the first data communication by the first communication path by the first standard between the electronic devices and the second data communication by the second communication path according to the second standard. In various embodiments of the present disclosure, the first standard may be assumed to support higher speed data communication than the second standard.

The camera module 470 (for example, the camera module 291) may indicate a configuration that supports a photographing function of the electronic device 400. The camera module 470 may photograph a random object according to a control of the controller 480 and transfer photographed data (e.g., an image) to the display 431 and the controller 480. In various embodiments of the present disclosure, the camera module 470 may be disposed on a particular location (for example, the middle or top of the body of the electronic device 400) at which the electronic device 400 may photograph.

The controller 480 may control a general operation of the electronic device 400. According to various embodiments of the present disclosure, the controller 480 may control operations associated with transmitting, through an electric path, analog ID information received through at least one pin of a connector, generating digital ID information based on the transmitted analog ID information, and determining information to be transmitted to the external device based on the generated digital ID information.

The controller 480 may include one or more processors for controlling the operation of the electronic device 400. In various embodiments of the present disclosure, the controller 480 may control operations of hardware modules such as the interface unit 460, etc. Hereinafter, with reference to the accompanying drawings, will be described control operations by the controller 480, and interface control operation for connection between devices and data communication according to various embodiments of the present disclosure.

According to various embodiments of the present disclosure, the controller 480 may be interlocked with software modules stored in the memory 450, and perform a connection operation between devices and data communication operation of the electronic device 400 according to various embodiments of the present disclosure.

According to various embodiments of the present disclosure, the controller 480 may be embodied as one or more processors that control the operations of the electronic device 400 according to various embodiments of the present disclosure by executing one or more programs stored in the memory 450.

The power supply unit 490 may receive external power or internal power based on the control of the controller 480, and may supply power required for the operation of each element. In various embodiments of the present disclosure, the power supply unit 490 may supply or block power (on/off) to the display 431, the camera module 470, etc. under a control of the controller 480.

Various embodiments described in the present disclosure may be implemented in a computer or a similar device-readable recording medium through software, hardware or a combination thereof.

Figure 5:
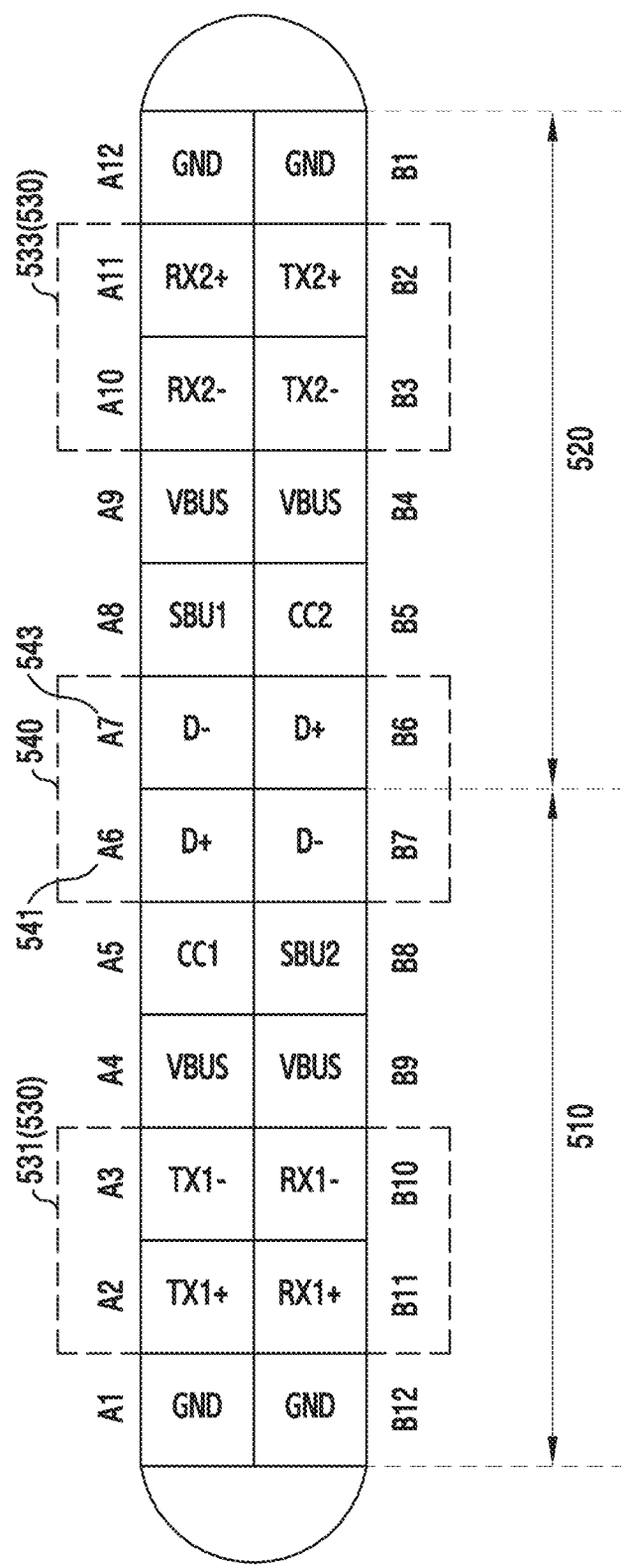
FIG. 5 illustrates a universal serial bus (USB) interface supported by an electronic device and an operation thereof according to an embodiment of the present disclosure.

FIG. 5 illustrates a USB interface supported by the electronic device and an operation thereof according to an embodiment of the present disclosure.

Referring to FIG. 5, FIG. 5 illustrates an example of a structure of a functional pin of a USB Type-C interface used in the embodiment of the present disclosure.

Referring to FIG. 5, FIG. 5 illustrates an example of a structure of an input/output pin-out of the USB interface (for example, USB Type-C). The USB interface may be largely divided into a first part 510 and a second part 520, and the first part 510 and the second part 520 may have a symmetrical structure. When the USB interface (for example, USB connector) of the electronic device is connected to a. USB cable or gender, the USB interface may be connected to the USB cable based on the symmetrical structure regardless of connectivity. For example, since connectors at both ends of the USB cable may have the same shape (form) and the connector does not distinguish between front and back, the immediate connection is possible without the need to match pin directivity of the connector. For example, the USB interface may be connected right-side-up (place the first part 510 up) or, inversely, the USB interface may be connected upside-down (place the first part 510 down). The connection state of the USB interface may be detected through CC (for example, CC1 (A5 pin) or CC2 (B5 pin)). When a pull-down Rd is detected at the CC1 (A5 pin) of the USB interface, the first part 510 may be in a plugged state, and when a pull-down is detected at CC2 (B5 pin) of the USB interface, the second part 520 may be in a plugged state.

The USB interface may include, for example, a total of 24 designated pins (for example, A1 to A12 and B1 to B12), and each of the 24 number of pins may have an individual role as illustrated in FIG. 5.

The USB interface may support, for example, data communication at different transmission rates. For example, the USB interface may include a first communication path 530 corresponding to a first standard (for example, USB 3.1) supporting high speed data communication and a second communication path 540 corresponding to a second standard (for example, USB 2.0) supporting low speed data communication. The first communication path 530 of the first standard (for example, USB 3.1) may be configured to be one pair 531 in the first part 510, and may be configured to be one other pair 533 in the second part 520. The second communication path 540 of the second standard (for example, USB 2.0) may be configured to be one pair 541 in the first part 510, and may be configured to be one other pair 543 in the second part 520. That is, the first communication path 530 and the second communication path 540 may be implemented to be symmetrical in the first part 510 and second part 520 corresponding to the symmetrical structure of the USB interface.

The electronic devices may, when connected to each other through the USB interface, divided to operate as a host (for example, downstream facing port (DFP)) and a slave (for example, upstream facing port (UFP), and the division may be specified through the CC (for example, CC1 or CC2) terminal of the USB interface. For example, for the connection method using the USB interface, CC1 and CC2 exist for recognizing the connector tightening direction and digital data communication, and the role of the host (DFP) and the slave (UFP) may be defined by the pull-up (Rp) or current sourcing and pull-down (Rd). For the USB interface, the side in which the pull-down (Rd) exists is defined as the slave (UFP), and the host (DFP) may supply power through a power supply pin (for example, virtual bus (VBUS), power rail (e.g., VCONN)) according to the needs of the slave (UFP).

Further, the electronic devices may operate as a Dual Role Port (DRP) as well as the host (DFP) and the slave (UFP). The DRP may indicate a mode (function) in which the roles of the host (DFP) and the slave (UFP) can be adaptively changed. For example, when the DRP is connected as the host (DFP), the DRP may be changed to the slave (UFP). When the DRP is connected as the slave (UFP), the DRP may be changed to the host (DFP). Further, when two DRPs are connected together, one DRP may serve as the host (DFP) and the other DRP may serve as the slave (UFP) in a random manner. For example, electronic devices such as smart phones or PCs may serve as both the host (DFP) and the slave (UFP) and, fir this purpose, may perform periodical toggling of the pull-up and pull-down.

A VBUS of the USB interface may indicate a power supply terminal and support power corresponding to each USB standard illustrated in Table 1 below.

TABLE 1

| Mode of Operation | Nominal Voltage | Maximum Current | Notes |
| --- | --- | --- | --- |
| USB 2.0 | 5 V | 500 mA | Default Current, based on definitions in the base specifications |
| USB 3.1 | 5 V | 900 mA | Legacy charging |
| USB BC 1.2 | 5 V | Up to 1.5 A | Supports higher power devices |
| USB Type-C Current @ 1.5 A | 5 V | 1.5 A | Supports higher power devices |
| USB Type-C Current @ 3.0 A | 5 V | 3 A | Supports higher power devices |
| USB PD | Configurable up to 20 V | Configurable up to 5 A | Directional control and power level management |

As shown in Table 1 above, the USB interface according to an embodiment of the present disclosure may support a power capability up to 5 V/3 A. When USB PD is combined with the USB Type-C, the USB interface may support a power capability up to 20 V/5 A. A USB PD protocol may be transmitted through a CC line connection.

In general, when the electronic devices are designated as the host (DFP) and the slave (UFP), an electronic device that operates as the host (DFP) may transfer data to an electronic device that operates as the slave (UFP), and as a first operation, it may transfer data through the first standard (for example, USB 3.1) transmission terminal (for example, the first communication path 530) designated in two pairs at the USB interface. Alternatively, when the electronic devices are not compatible with the first standard, data may be transmitted through the transmission port of the second standard (for example, USB 2.0) transmission terminal (for example, the second communication path 540) having one pair of pins.

For example, the USB interface may include data communication paths corresponding to different standards (for example, the first standard and the second standard) for data transmission as described above. According to an embodiment of the present disclosure, the USB interface may be divided into the first communication path 530 for data communication (for example, super speed plus (SSP), 10 Gbps communication) based on the communication speed of a first standard (for example, USB 3.1), and a second communication path 540 for data communication (for example, high speed, 480 Mbps communication) based on the communication speed of a second standard (for example, USB 2.0). When the electronic device, connected through the USB interface and operating as the host (DFP), transmits data to the electronic device that operates as the slave (UFP), data communication can be preferentially performed in the first communication path 530 (e.g., a path having a higher data transmission speed is preferentially set) of the first standard having a higher priority (for example, the communication speed is fast).

On the other hand, for the USB Type-C interface, since it is defined that all data connections and controls are to be performed by transmitting and receiving a digital signal to and from the CC1 and CC2 as described above, device ID (e.g., the USB ID recognition) of a legacy system supporting the USB 2.0 interface may not be possible according to the related art. For example, when connecting the USB 2.0 format accessory such as a generally-used OTG, data cable, or wall charger to an electronic device to which the USB Type-C is applied, the electronic device may not be identified, resulting in a problem of data communication failure.

In various embodiments of the present disclosure, a method and apparatus will be described which can ensure the compatibility with the USB 2.0 format accessory which is currently generally used in various ways when USB 3.1 Type-C is applied.

According to various embodiments of the present disclosure, proposed are an apparatus (for example, a gender or an electronic device) for enabling the interface compatibility between a legacy system that uses a low level interface standard (for example, USB 2.0) and an electronic device that uses a high level interface standard (for example, USB 3.1) and an operation method thereof. Hereinafter, with reference to the drawings an interface providing method and apparatus for supporting backward compatibility with legacy micro-USB (five pins) by the USB 3.1 type C (24 number of pins) will be described according to various embodiments of the present disclosure.

Figure 6:
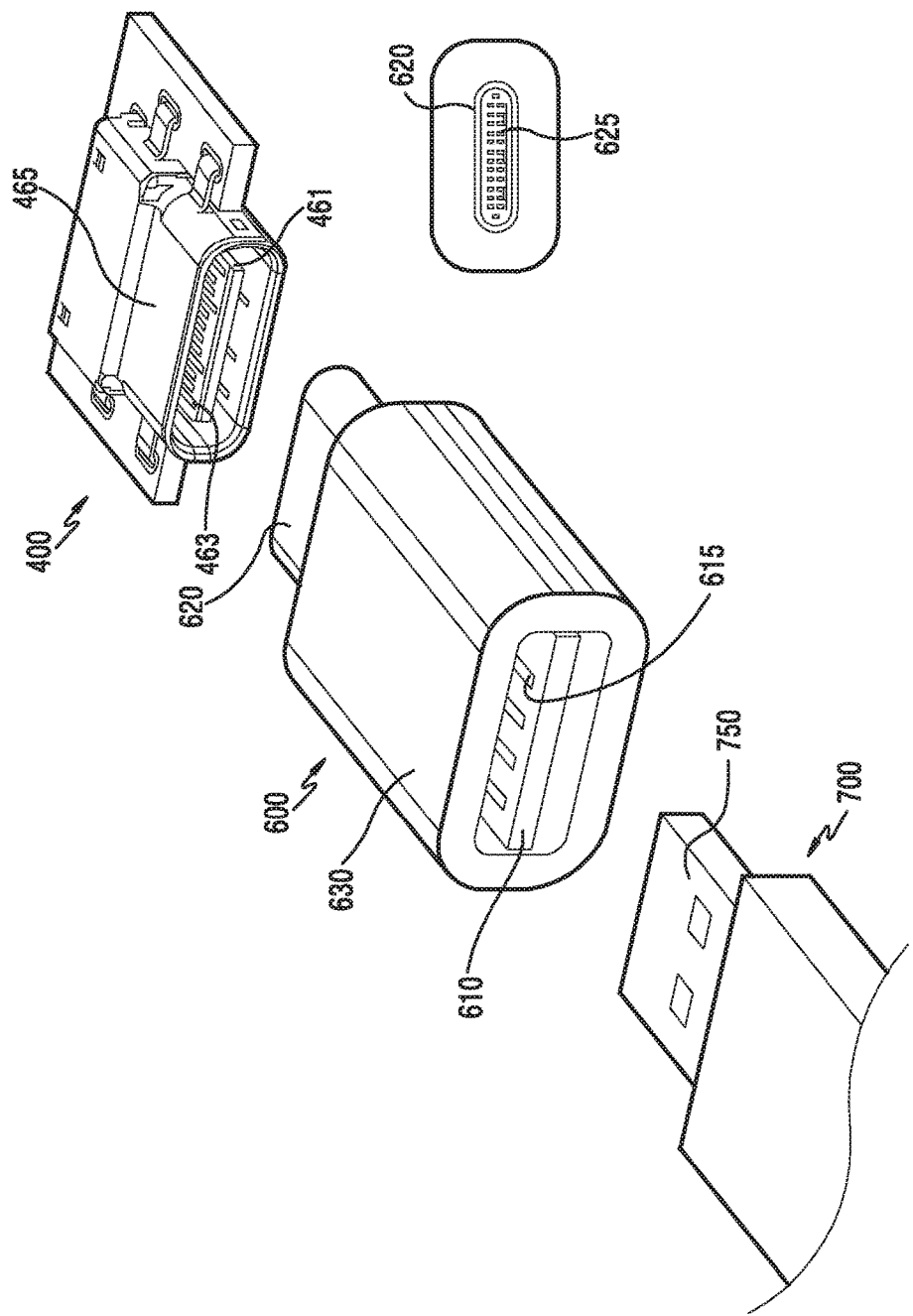
FIG. 6 is a diagram illustrating a structure of a gender according to various embodiments of the present disclosure.

FIG. 6 is a diagram illustrating a structure of a gender according to various embodiments of the present disclosure.

Referring to FIG. 6, it schematically shows a structure of a device 600 (for example, a gender) for supporting various data communication by interface connection between a legacy system of a low level interface standard and an electronic device of a high level interface standard.

In various embodiments of the present disclosure, the first external electronic device 700 may indicate a legacy system in which a USB interface (for example, USB 2.0 standard pin-out such as Micro A, B, AB, etc.) is employed according to the related art. For example, the first external electronic device 700 may include USB 2.0 accessories such as a generally-used OTG, data cable, wall charger, etc. or an electronic device such as PC.

In various embodiments of the present disclosure, a gender 600 may include a first connector 610 for a low level interface standard (for example, USB 2.0 interface), a second connector 620 for a high level interface standard (for example, the USB 3.1 Type-C interface of FIG. 5), and a housing 630 (for example, the body) including the first connector 610 and the second connector 620 and various circuits for electrical connection between the first connector 610 and second connector 620.

In various embodiments of the present disclosure, the first connector 610 may be exposed to the outside of the housing 630 and include a first number of pins 615 (for example, X number of pins (e.g., four, five, or nine), X is a natural number). The first connector 610 may have an asymmetrical shape in at least one direction (for example, a micro USB has an asymmetric shape in only up and down directions as illustrated in FIG. 6. In various embodiments of the present disclosure, the second connector 620 may be exposed to the outside of the housing 630 and include a second number of pins 625 (for example, Y number of pins (e.g., 24 number of pins), Y is a natural number greater than X). The second connector 620 may have an asymmetrical shape in at least two directions (for example, horizontal and vertical symmetrical shape) as illustrated in FIG. 6. In various embodiments of the present disclosure, the first number of pins and the second number of pins are different from each other according to the type of the gender 600 to be implemented (for example, the first number of pins is configured to be fewer than the second number of pins) or to be implemented with the same number (for example, the first number and second number of pins are configured to be 24).

In various embodiments of the present disclosure, the gender 600 may include a circuitry (not shown) for providing an electrical connection between the first number of pins 615 of the first connector 610 and the second number of the pins 625 of the second connector 620.

In various embodiments of the present disclosure, a first connector 610 of the gender 600 may be connected to the first external electronic device 700 (for example, legacy systems such as USB 2.0 interface accessories) (for example, a connector 750 of the first external electronic device 700 and the first connector 610 of the gender 600 may be joined). In various embodiments of the present disclosure, a second connector 620 of the gender 600 may be connected to the second external electronic device 400 (for example, the electronic device 400 of FIG. 4) (for example, the second connector 620 of the gender 600 and a connector 461 of the second external electronic device 400 may be tightened). In various embodiments of the present disclosure, the connection between the gender 600, the first external electronic device 700, and the second external electronic device 400 is not limited to the above. For example, according to an interface standard supported by the gender 600, the first external electronic device 700, and the second electronic device 400, the second connector 620 of the gender 600 may be connected to the first external electronic device 700 (for example, when the first external electronic device 700 supports the USB 3.1 Type-C interface), and the first connector 610 of the gender 600 may be connected to the second external electronic device 400 (for example, when the second external electronic device 400 is a legacy system supporting USB 2.0 interface).

In various embodiments of the present disclosure, although the first connector 610 and second connector 620 of the gender 600 are illustrated in different shapes (for example, a female connector and a male connector), the first connector 610 and second connector 620 may be implemented in the same shape (for example, the female connector/female connector or male connector/male connector) depending on the design of the gender 600, and also be implemented in the opposite shape to the male and female connectors illustrated as examples of FIG. 6.

In various embodiments of the present disclosure, when the first external electronic device 700 is connected through the first connector 610 and the second external electronic device 400 is connected through the second connector 620, the gender 600 may acquire (receive) analog ID information associated with the first external electronic device 700 through at least one of the first number of pins 615 of the first connector 610. The gender 600 may generate digital ID information based on at least some of the received analog ID information and provide the generated digital ID information to the at least one of the second number of pins 625. In various embodiments of the present disclosure, the digital ID information can be transmitted to the second external electronic device 400 through at least one of the second number of pins 625.

In various embodiments of the present disclosure, when the first external electronic device 700 is connected through the first connector 610 and the second external electronic device 400 is connected through the second connector 620, the gender 600 may acquire (receive) at least one of analog ID information, data information, or power information associated with the first external electronic device 700 through at least one of the first number of pins 615 of the first connector 610. The gender 600 may convert the received analog ID information to digital ID information. The gender 600 may provide the converted digital ID information to the second external electronic device 400 through the first path of the second connector 620 (for example, an electrical path including at least one of the second number of pins 625). In addition, the gender 600 may provide the received data information or power information to the second external electronic device 400 through the second path of the second connector 620 (for example, an electrical path including at least one other pin of the second number of pins 625).

In various embodiments of the present disclosure, when the first external electronic device 700 is connected through the first connector 610, and the second external electronic device 400 is connected through the second connector 620, the gender 600 may be configured to determine the type of the first external electronic device 700, and then convert the analog ID information associated with the first external electronic device 700 into the digital ID information. On the other hand, the gender 600 may be configured to convert the analog ID information associated with the first external electronic device 700 into the digital ID information without determining the type of the first external electronic device 700.

In various embodiments of the present disclosure, the second external electronic device 400 may represent the electronic device to which the USB 3.1 Type-C interface is employed. For example, the second external electronic device 400 may have the same configuration as or similar configuration to the electronic device of FIG. 4 and, for example, include an electronic device such as a smart phone, and in FIG. 6, the interface part of the second external electronic device 400 is illustrated.

In various embodiments of the present disclosure, the second external electronic device 400 may include the connector 461 for a high level interface standard (for example, USB 3.1 Type-C Interface), a predetermined number of pins 463 (for example, Y number of pins (e.g., 24), and a housing 465 (for example, the body) including a gender 600 by the connector 461 and the predetermined number of pins 463. In various embodiments of the present disclosure, on the basis of at least some of the predetermined number of the pins 463, one or more electrical paths (for example, a plurality of paths that are separated by a plurality of pins) can be formed.

In various embodiments of the present disclosure, the second external electronic device 400 can be connected to external devices (for example, a gender 600 or a first external electronic device 700) through the connector 461. In addition, although not shown in FIG. 6, the second external electronic device 400 may include a processor (for example, the controller 480 in FIG. 4) electrically connected with the connector 461 and the predetermined number of pins 463, and a memory (for example, reference numeral 450 in FIG. 4) electrically connected with the processor. In various embodiments of the present disclosure, the memory may generate digital ID information based on the analog ID information of an external device connected through the connector 461, and store instructions for determining information to be transmitted to the external device based on the generated digital ID information.

In various embodiments of the present disclosure, when the external device is connected through the connector 461, the second external electronic device 400 may acquire information (for example, an analog ID information) of the external device through the predetermined number of pins 463 electrically connected to the connector 461. The second external electronic device 400 (for example, processors) may transmit the analog ID information received through at least one pin of the connector 461 through the electrical path, and generate digital ID information on the basis of the transmitted analog ID information. The second external electronic device 400 may determine information to be transmitted to the external device (for example, the gender 600) based on the generated digital ID information.

In various embodiments of the present disclosure, the connector 461 may be exposed to the outside of the housing 465 and include a predetermined number of pins 463. In various embodiments of the present disclosure, electrical paths electrically connected to the connector 461 may be included in the interior of the housing 465, and at least some of the electrical paths may be electrically connected to the processor.

In various embodiments of the present disclosure, the second external electronic device 400 may include a circuit that provides an electrical connection between the first number of pins and the second number of electrical paths, and the first number and the second number may be different from each other. When the external device (for example, the gender 600 or the first external electronic device 700) is connected through the connector 461, the second external electronic device 400 may receive analog ID information through at least one of the first number of pins, and generate digital ID information based at least some of the received analog ID information. The second external electronic device 400 may be implemented to provide the generated digital ID information to at least one of the second number of electrical paths.

Figure 7:
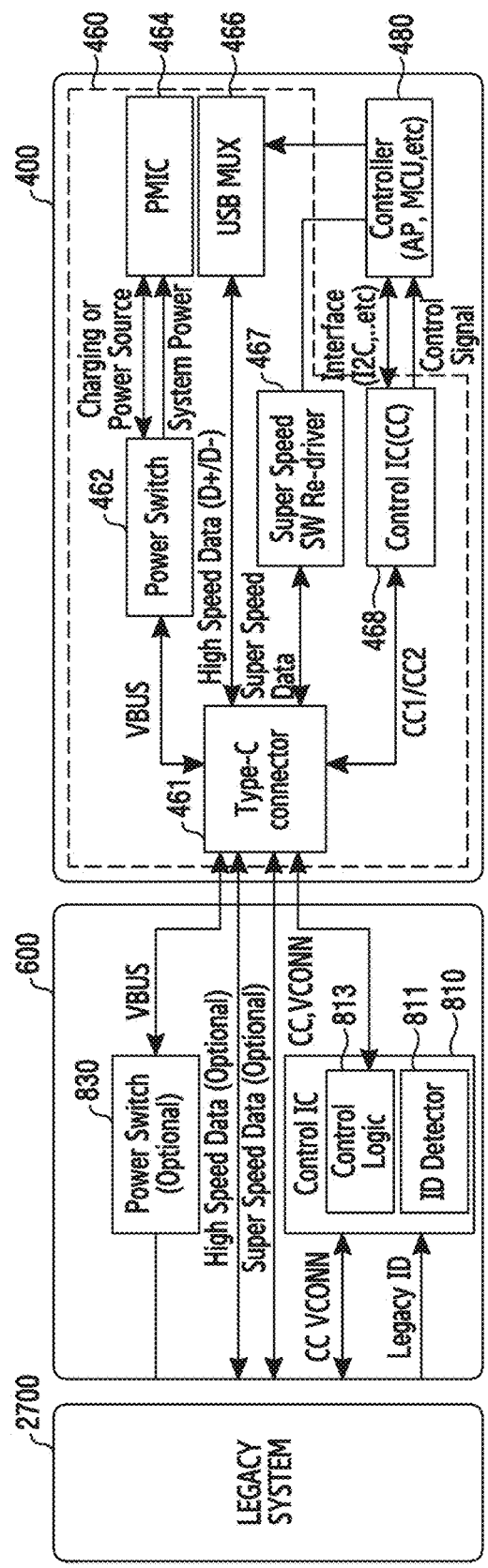
FIG. 7 is a diagram illustrating a system configuration for describing operations for providing an interface between devices according to various embodiments of the present disclosure.

FIG. 7 is a diagram illustrating a configuration of a system for describing operations for providing an interface between devices according to various embodiments of the present disclosure.

Referring to FIG. 7, a system according to various embodiments may be divided into a legacy system 2700, a gender 600, and electronic device 400.

In various embodiments of the present disclosure, the legacy system 2700 may indicate various accessories such as OTG, data cable, wall charger or a PC to which a low level interface standard (for example, USB 2.0 interface) is applied.

In various embodiments of the present disclosure, the gender 600 may serve a role for the interface compatibility between the legacy system 2700 and the electronic device 400 to which the high level interface standard (for example, USB 3.1 Type-C interface) is applied. In various embodiments of the present disclosure, the gender 600 may convert the input signal (for example, a digital signal) from the legacy system and provide the converted input signal to the electronic device 400 so as to enable the device ID (for example, USB ID recognition) of the legacy system 2700 by the electronic device 400.

In various embodiments of the present disclosure, the gender 600 may include a control circuit (for example, control IC) 810 and a power switch 830.

The control IC 810 may include an ID detector 811 and a control logic 813.

The ID detector 811 may be a circuit for identifying the device of the legacy system 2700, for example, a circuit for recognizing the of the USB 2.0 device. In various embodiments of the present disclosure, the ID detector 811 may include an ID DB table for various legacy systems 2700. In various embodiments of the present disclosure, the ID detector 811 may be configured to be an additional combination of a resistor array, analog-to-digital converter (ADC), comparator, detector, CC1/CC2 port pull down, etc. according to the predetermined recognizable number of IDs. In various embodiments of the present disclosure, the ID detector 811 may implement a particular operation with a pull-down resistor pre-defined to serve a specific purpose. For example, a pull-down open of a standard specification may be defined to be used for a charging or data cable, and it may operate as an OTG mode when in the case of a short GND.

According to an embodiment of the present disclosure, when used for a primary process for production or a test case, the gender 600 may configure the pull-down to be 255 K, 301 K, 523 K, 619 K, etc. On the other hand, when used as the gender for the USB 2.0 OTG, the gender 600 may configure the pull-down to be 0 ohm. On the other hand, when operating as an MHL dongle, the gender 600 may configure the pull-down to be 1 K. On the other hand, when the gender 600 is used as a wall charger or data cable, the pull-down can be open.

The ID detector 811 may output an interrupt signal for transmitting the external IC notification when recognizing an ID corresponding to the predefined device. According to an embodiment of the present disclosure, when a legacy system 2700 is connected, the ID detector 811 may detect the legacy ID (for example, analog ID information) transmitted from the legacy system 2700. The ID detector 811 may output a control signal (for example, JIG_ON) in response to the detection of an ID of the legacy system 2700. In various embodiments of the present disclosure, a simple low/high control signal may be implemented with open-drain or push pull.

The control logic 813 may include a CC control logic associated with CC recognition or selection (for example CC1 or CC2) for providing various pieces of control data (for example, analog ID information, digital ID information, data information, or power information, and the like). The control logic 813 may generate digital ID information on the basis of the analog ID information detected by the ID detector 811, and transmit the generated digital ID information to the electronic device 400.

In various embodiments of the present disclosure, in the gender 600, when external devices (for example, the legacy system 2700 and the electronic device 400) are connected through the first connector 610 and the electronic device 400 is connected through the second connector 620, the ID detector 811 may detect a legacy ID (for example, analog ID information related to the legacy system 2700) through at least one of the first number of pins 615 of the first connector 610 and may provide the analog ID information to the control logic 813. In the gender 600, the control logic 813 may generate digital ID information based on at least some of the received analog ID information and provide the generated digital ID information to the electronic device 400 through at least one of the second number of pins 625.

According to an embodiment of the present disclosure, in the gender 600, an ID detector 811 may recognize the legacy ID of the legacy system 2700 on the basis of an operation of pull down resistor recognition circuit, and generate an interrupt signal in response thereto. In the gender 600, the control logic 813 may transmit the legacy ID and a control signal (or notification) recognized by the ID detector 811 to the first external electronic device 700 through the second connector 620, in response to an interrupt signal of the ID detector 811. The control logic 813 may transmit the control data (for example, PD virtual device metafile (VDM) or unstructured VDM, etc.) to the electronic device 400 through the CC1 or CC2 port of the second number of pins 625 of the second connector 620.

In various embodiments of the present disclosure, the electronic device 400 may include an interface unit 460 such as a connector (e.g., Type-C connector) 461, a power switch 462, a PMIC 464, a USB multiplexer (MUX) 466, a switch (e.g., Super Speed SW Re-driver) 467, a control logic (for example, control IC) 468, etc., and a controller 480 (for example, a processor such as AP or microprocessor control unit (MCU)). In various embodiments of the present disclosure, the connector 461, the power switch 462, a PMIC 464, the USB MUX 466, the switch 467, and a control logic 468 of the interface unit 460 may be implemented based on the circuit corresponding to the design of the USB 3.1 Type-C interface and perform an operation corresponding thereto. Therefore, hereinafter only parts in an electronic device 400 related to the present disclosure in which a USB 3.1 Type-C interface is applied will be described, and a detailed description for the other parts will be omitted.

The electronic device 400 may receive the control data provided by the gender 600 through the connector 461, and input and process the control data to the control logic 468 within the electronic device 400. According to an embodiment of the present disclosure, the electronic device 400 may analyze the control data received from the control logic 468 (for example, CC/PD IC ID analysis) and transfer an interrupt to the controller 480. When detecting the interrupt of the control logic 468, the controller 480 may set a path (for example, DP/DM data path) in response thereto. In addition, the controller 480 may control to set a power path of the power switch 462 on the basis of the control signal of the control logic 468.

In various embodiments of the present disclosure, the power switch 830 of the gender 600 and the power switch 462 of the electronic device 400 may be intended for separating the power path. For example, the power switch (830 or 462) may serve a role of separating the power source input to the VBUS port. For example, the power path may be separated into a system power connection path and a charging IC input path. That is, the power switch (830 or 462) may serve a role of controlling the power switch path. According to an embodiment of the present disclosure, when detecting the USB ID defined through the control logic 468, the gender 600 may transmit control data through a CC1 or CC2 port of a USB Type-C interface. The gender 600 may output a CC IC Control signal (JIG_ON) according to a pre-defined ID so as to process the path control of the power switch 830.

In various embodiments of the present disclosure, a VCONN power source, for example, a power source input to the legacy system 2700 including Ra that is a powered cable indicator may add a 5V booster circuit so as to support various legacy systems 2700 (for example, accessories) by increasing a current capacity compared to a standard specification.

According to various embodiments of the present disclosure, the power switch 830 of the gender 600 and the power switch 462 of the electronic device 400 may be omitted according to a circuit design.

Figure 8:
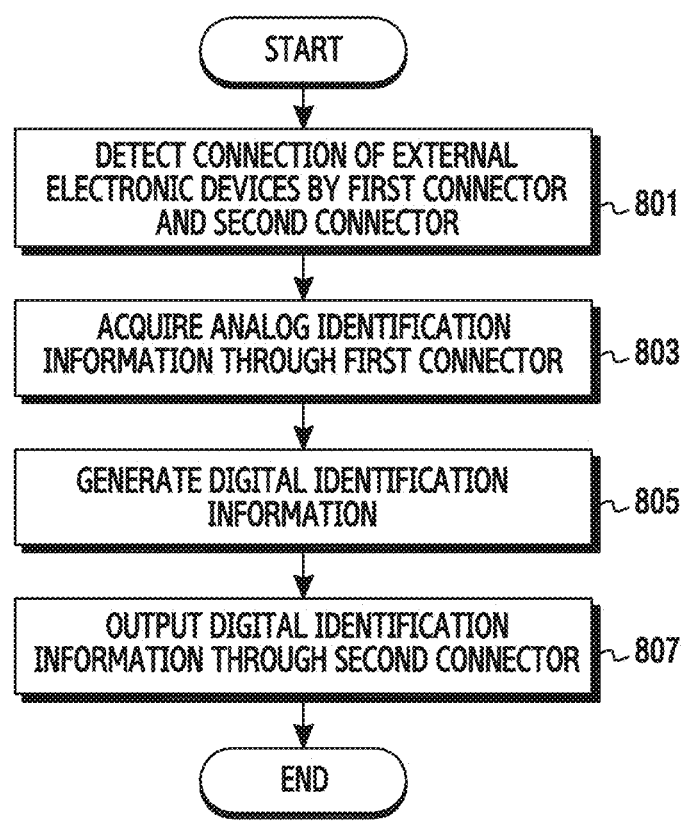
FIGS. 8 and 9 are diagrams illustrating an operation of an interface device according to various embodiments of the present disclosure.

FIG. 8 is a flowchart illustrating an operation of an interface device according to various embodiments of the present disclosure.

Referring to FIG. 8, in various embodiments of the present disclosure, a method for providing an interface between the gender 600 which supports different interface standards (for example, USB 2.0 interface, USB 3.1 Type-C interface) and electronic devices (for example, the legacy system 2700, the electronic device 400) which support different interface standards.

In operation 801, the gender 600 may detect the connection of external electronic devices by a first connector 610 and second connector 620. According to an embodiment of the present disclosure, the legacy system 2700 which supports a USB 2.0 interface may be connected through the first connector 610 of the gender 600, and the electronic device 400 which supports USB 3.1 Type-C interface may be connected through the second connector 620 of the gender 600.

In operation 803, the gender 600 may acquire analog ID information through the first connector 610. According to an embodiment of the present disclosure, the gender 600 may receive the analog ID information (for example, legacy ID, USB ID) associated with the legacy system 2700 through at least some of the first number of pins 615 of the first connector 610. For example, in the gender 600, the ID detector 811 may detect that a particular device is connected through the first connector 610 based on the pull-down resistor recognition operation and cause an interrupt accordingly.

In operation 805, the gender 600 may generate digital ID information based on the analog ID information acquired through the first connector 610. According to embodiment of the present disclosure, in the gender 600, the control logic 813 may generate digital ID information (for example, legacy ID, USB ID) for outputting the analog ID information to the electronic device 400 based on the USB 3.1 Type-C interface, in response to the occurrence of the interrupt of the ID detector 811.

In operation 807, the gender 600 may output the digital ID information through the second connector 620. According to an embodiment of the present disclosure, the gender 600 may provide the digital ID information to the electronic device 400 through the first path of the second connector 620 (for example, an electrical path (for example, CC1 or CC2) including at least some of the second number of pins 625).

Figure 9:
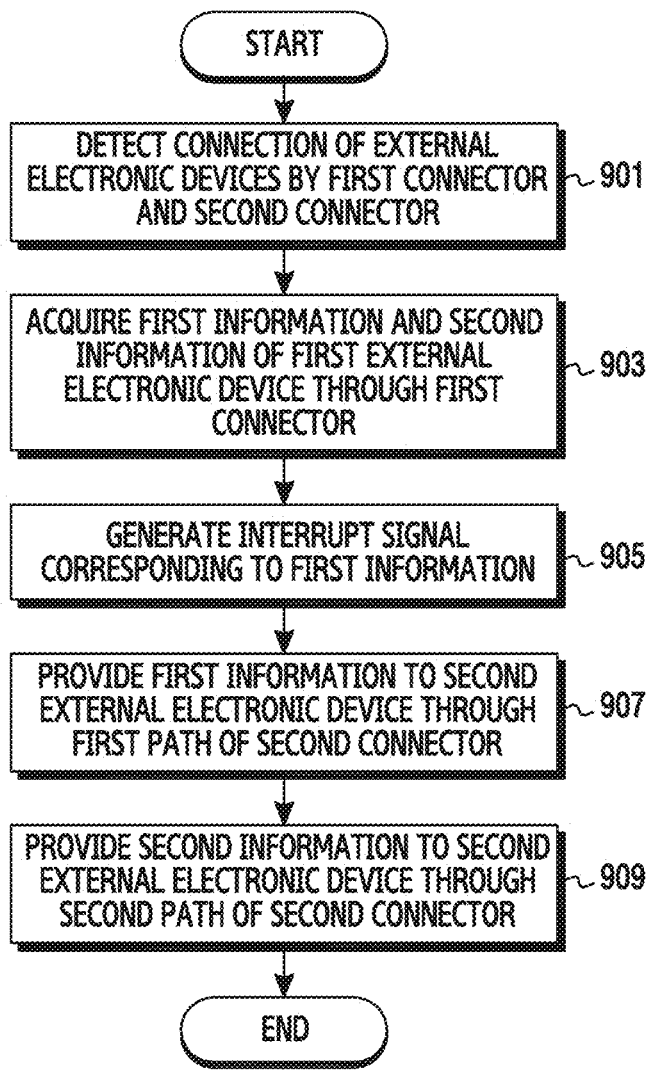

FIG. 9 is a flowchart illustrating an operation of an interface device according to various embodiments of the present disclosure.

Referring to FIG. 9, a method is shown, in various embodiments of the present disclosure, for providing an interface between the gender 600 which supports different interface standards (for example, USB 2.0 interface, USB 3.1 Type-C interface) and electronic devices (for example, the legacy system 2700, the electronic device 400) which support different interface standards.

In operation 901, the gender 600 may detect the connection of external electronic devices by the first connector 610 and the second connector 620. According to an embodiment of the present disclosure, the legacy system 2700 which supports a USB 2.0 interface may be connected through the first connector 610 of the gender 600, and the electronic device 400 which supports USB 3.1 Type-C interface may be connected through the second connector 620 of the gender 600.

In operation 903, the gender 600 may acquire the first information and second information of the first external electronic device 700 (e.g., legacy systems) through the first connector 610. According to an embodiment of the present disclosure, analog ID information (first information) (for example, legacy ID, USB ID), data information, or power information (for example, the second information) associated with the first external electronic device 700 may be acquired through at least some of the first number of pins 615 of the first connector 610.

In operation 905, the gender 600 may generate an interrupt signal (for example, digital ID information) corresponding to the first information.

In operation 907, the gender 600 may provide the interrupt signal to the second electronic device 400 through the first path of the second connector 620 (for example, an electrical path (for example, CC1 or CC2 pin, (sideband use 1 (SBU1) or sideband use 2 (SBU2) pin) including at least some of the second number of pins 625).

In operation 909, the gender 600 may provide the second information to the second external electronic device 400 through the second path of the second connector 620 (for example, an electrical path (for example, VBUS) including at least other pins of the second number of pins 625).

According to various embodiments of the present disclosure, the operation 907 and the operation 909 are not necessarily limited to the above-described process, and the sequence of the operation 907 and the operation 909 may be changed or organically occur in the same time zone (for example, parallel performance). For example, the purpose of various embodiments of the present disclosure is to transfer information (for example, ID) between devices through different paths (for example, a first path, a second path), and for example, in various embodiments of the present disclosure, the transfer of information (for example, ID) may be performed before and after the CC control, or simultaneously (in parallel) thereof.

Figure 10:
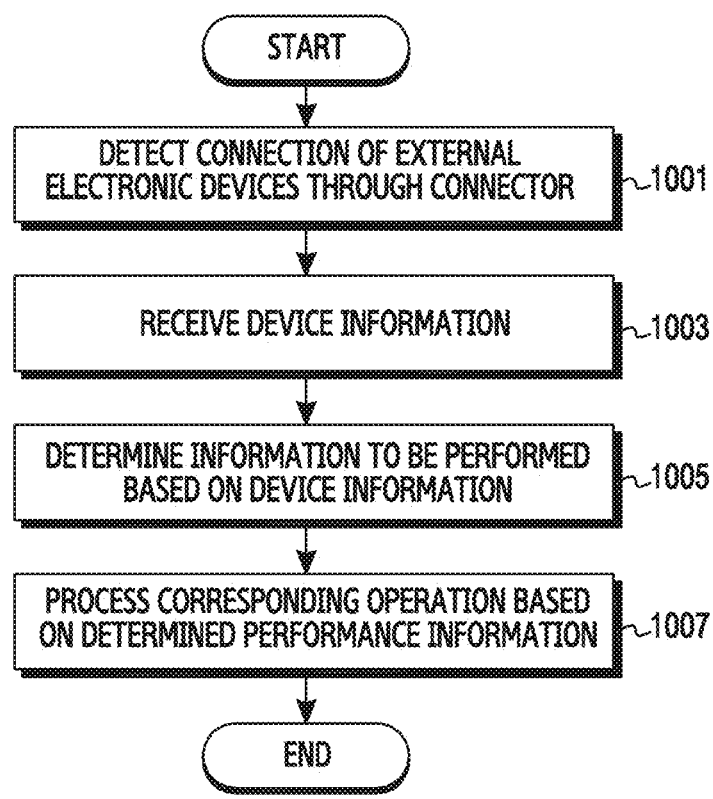
FIGS. 10 to 12 are diagrams illustrating an operation of an electronic device according to various embodiments of the present disclosure.

FIG. 10 is a flowchart illustrating an operation of an electronic device according to various embodiments of the present disclosure.

Referring to FIG. 10, FIG. 10 illustrates a method for providing an interface with one other device (for example, a legacy system) connected to the gender 600 based on information input from the gender 600 to which the electronic device 400 supporting a high level interface standard (for example, USB 3.1 Type-C interface is connected.

In operation 1001, the electronic device 400 may detect the connection of an external device by the connector 461. According to an embodiment of the present disclosure, the electronic device 400 may be connected to the USB 3.1 Type-C interface part of the gender 600 through the connector 461.

In operation 1003, the electronic device 400 may receive the device information (for example, digital ID information) through the connector 461. According to an embodiment of the present disclosure, the electronic device 400 may receive digital ID information (for example, legacy ID, USB ID) associated with the legacy system, generated from the gender 600.

In operation 1005, the electronic device 400 may determine performance information on the basis of the device information. According to an embodiment of the present disclosure, the electronic device 400 may recognize an ID of the connected external device based on the digital ID information, and determine a device corresponding to the recognized ID and performance information corresponding to a predetermined function (for example, charging, data communication, etc.). To this end, the electronic device 400 may include an ID DB table.

In operation 1007, the electronic device 400 may process the corresponding operation on the basis of the determined performance information. According to an embodiment of the present disclosure, the electronic device 400 may process a data communication operation or process a charging operation in conjunction with the connected external device.

Figure 11:
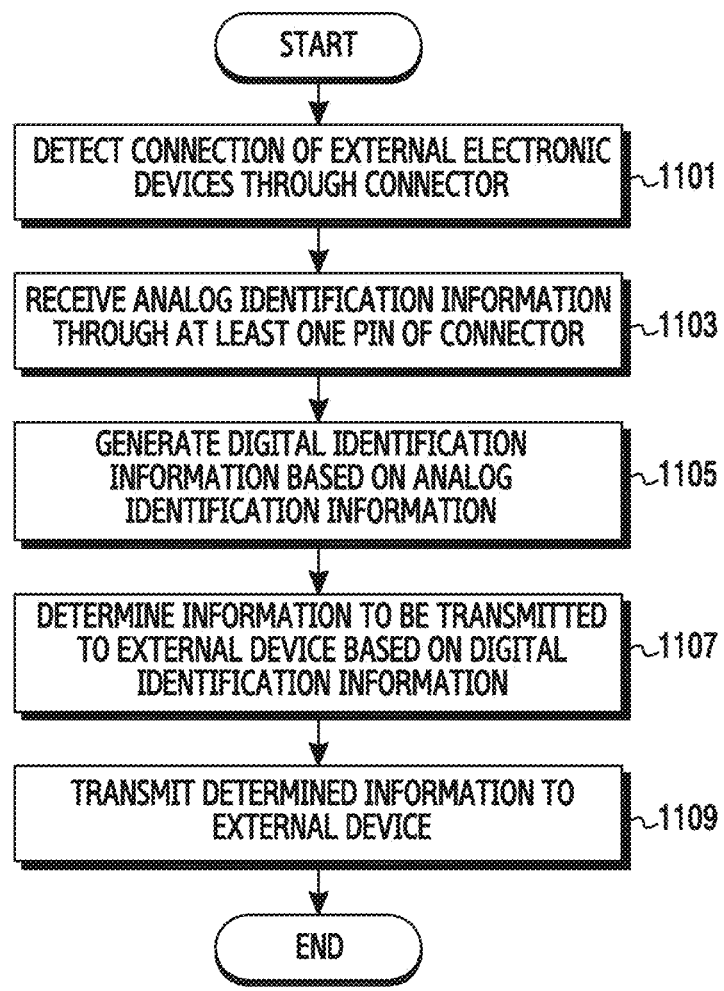

FIG. 11 is a flowchart illustrating an operation of an electronic device according to various embodiments of the present disclosure.

Referring to FIG. 11, FIG. 11 illustrates a method, in various embodiments of the present disclosure, for providing an interface with one other device (for example, a legacy system) connected to the gender 600 based on information input from the gender 600 to which the electronic device 400 supporting a high level interface standard (for example, USB 3.1 Type-C interface) is connected. In particular, there is shown an operation example of a case where a conversion circuit is omitted in the gender 600 which relays an interface between the legacy system 2700 and the electronic circuit unit 400 and the electronic device 400 includes the conversion circuit implemented in the gender 600. In such a case, the electronic device 400 may include an ID DB table for the device ID of the legacy system.

In operation 1101, the electronic device 400 may detect the connection of an external device by the connector 461. According to an embodiment of the present disclosure, the electronic device 400 may be connected to the USB 3.1 Type-C interface part of the gender 600 through the connector 461.

In operation 1103, the electronic device 400 may receive analog ID information through at least one pin of the connector 461.

In operation 1105, the electronic device 400 may generate digital ID information based on the analog ID information received through the connector 461. According to an embodiment of the present disclosure, in the electronic device 400, the control logic 468 generates digital ID information (for example, legacy ID, USB ID) based on analog ID information.

In operation 1107, the electronic device 400 may determine information to be transmitted to the external device on the basis of the digital ID information. According to an embodiment of the present disclosure, the electronic device 400 may determine and generate information related to the data communication with the connected external device based on the digital ID information.

In operation 1109, the electronic device 400 may transmit the determined information to the external device.

Figure 12:
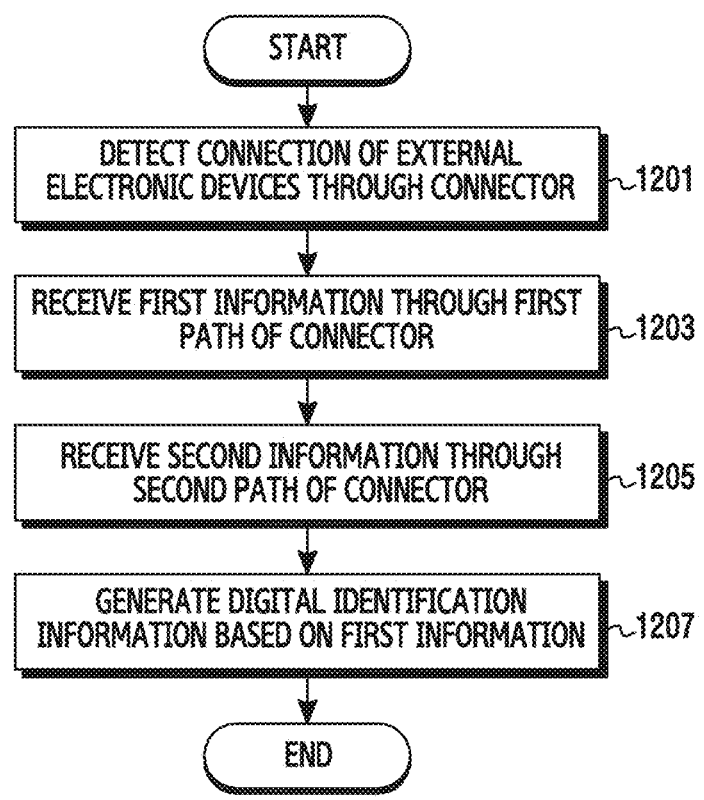

FIG. 12 is a flowchart illustrating an operation of an electronic device according to various embodiments of the present disclosure.

Referring to FIG. 12, FIG. 12 illustrates a method, in various embodiments of the present disclosure, for providing an interface with one other device (for example, a legacy system) connected to the gender 600 based on information input from the gender 600 to which the electronic device 400 supporting a high level interface standard (for example, USB 3.1 Type-C interface) is connected. In particular, there is shown an operation example of a case where a conversion circuit is omitted in the gender 600 which relays an interface between the legacy system 2700 and the electronic device 400, and the electronic device 400 includes the conversion circuit implemented in the gender 600. In such a case, the electronic device 400 may include an ID DB table for the device ID of the legacy system.

In operation 1201, the electronic device 400 may detect the connection of an external device by the connector 461. According to an embodiment of the present disclosure, the electronic device 400 may be connected to the USB 3.1 Type-C interface part of the gender 600 through the connector 461.

In operation 1203 and operation 1205, the electronic device 400 may receive first information according to the first path of the connector 461 and second information according to the second path of the connector 461. According to an embodiment of the present disclosure, the electronic device 400 may receive first information (for example, analog ID information) through at least one pin corresponding to the first path of the connector 461, and receive second information (for example, data information or power information) through at least one other pin corresponding to the second path of the connector 461.

In operation 1207, the electronic device 400 may generate digital ID information corresponding to the first information received through the connector 461. According to an embodiment of the present disclosure, in the electronic device 400, the control logic 468 may generate digital ID information (for example, legacy ID, USB ID) based on analog ID information.

In operation 1209, the electronic device 400 may perform the processing of an operation based on the first information and second information. According to an embodiment of the present disclosure, the electronic device 400 may perform the device ID of the external device according to the digital ID information generated based on the first information, and process an operation according to the second information corresponding to the identified device. For example, the electronic device 400 may process an operation related to the data communication corresponding to the data information, and process an operation related to the charging corresponding to the power information.

Hereinafter, with reference to FIGS. 13 to 17 various system configurations will be described for providing an interface between devices in the various embodiments of the present disclosure. Various systems shown and described below may be classified as a legacy system 2700, a gender 600, and an electronic device 400, which may correspond to the legacy system 2700, the gender 600, and the electronic device 400 described previously with reference to FIG. 7, but they may be different in some configurations. Therefore, in the following description with reference to FIGS. 13 to 17, the detailed description of the parts corresponding to FIG. 7 will be omitted and parts related to the embodiment corresponding to each of the drawings will be described.

Figure 13:
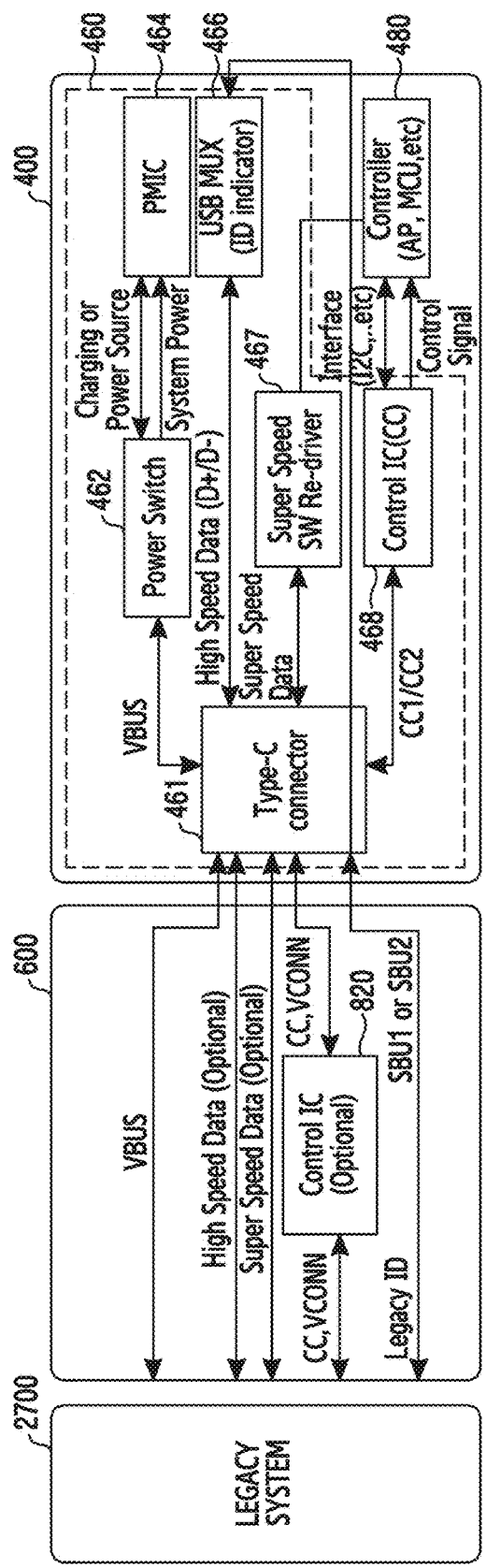
FIGS. 13 to 17 are diagrams illustrating a system configuration for describing operations for providing an interface between devices according to various embodiments of the present disclosure.

FIG. 13 is a diagram illustrating a configuration of a system for describing operations for providing an interface between devices according to various embodiments of the present disclosure.

Referring to FIG. 13, the system of FIG. 13 according to various embodiments may represent, for example, an example of a case where there is no configuration for the power switch and the ID detector in the gender 600 unlike FIG. 7.

Referring to FIG. 13, there is presented a case of providing compatibility between electronic devices having different interface standards by utilizing a user-defined pin other than the CC (for example, CC1 or CC2) of the USB 3.1 Type-C interface.

In the embodiment of FIG. 13, the gender 600 may serve a role of pin matching, and transmit the analog ID information (for example, legacy ID, USB ID) related to the connected legacy system 2700 (for example, PC, charger, etc.) to the electronic device 400 through a SBU (e.g., SBU1 or SBU2) pin of the USB 3.1 Type-C interface.

In an example of FIG. 13, the electronic device 400 may require a circuit which can recognize the analog ID information transmitted from the gender 600, and in various embodiments of the present disclosure, an ID indicator pre-defined in the USB MUX 466 may be utilized.

The electronic device 400 may receive the analog ID information through the SBU (for example, SBU1 or SBU2) of the connector 461, and, through the analog ID information, the data (for example, analog ID information) transmitted from the actual SBU through the ID indicator of the USB MUX 466 may be interpreted.

In various embodiments of the present disclosure, the gender 600 may detect an ID in response to the connection of the legacy system 2700, and transfer the detected ID through the SBU (for example, SBU1 or SBU2). On the other hand, in various embodiments of the present disclosure, the gender 600 may map an analog signal to an SBU, generate only the CC (for example CC1 or CC2) signal by a control IC 820 so as to communicate with the electronic device 400 (for example, the control logic 468), and, through the analog ID information (for example, legacy ID), interpret the actual SBU data in the ID indicator part of the USB MUX 466 of the electronic device 400.

In various embodiments of the present disclosure, an alternate mode may be utilized in which a protocol can be defined by the manufacturer of the USB 3.1 Type-C interface. For example, the gender 600 may perform the alternate mode switching, and then executes the manufacturer's separate protocol for the legacy system 2700. The gender 600 may transmit the USB ID detected from the connected legacy system 2700, by executing the protocol, to the electronic device 400 through the SBU. According to an embodiment of the present disclosure, the gender 600 may read the USB ID of the legacy system 2700 and perform the alternate mode switching to the CC (for example, CC1 or CC2) pin, and then may execute the manufacturer's separate protocol for the legacy system 2700.

Figure 14:
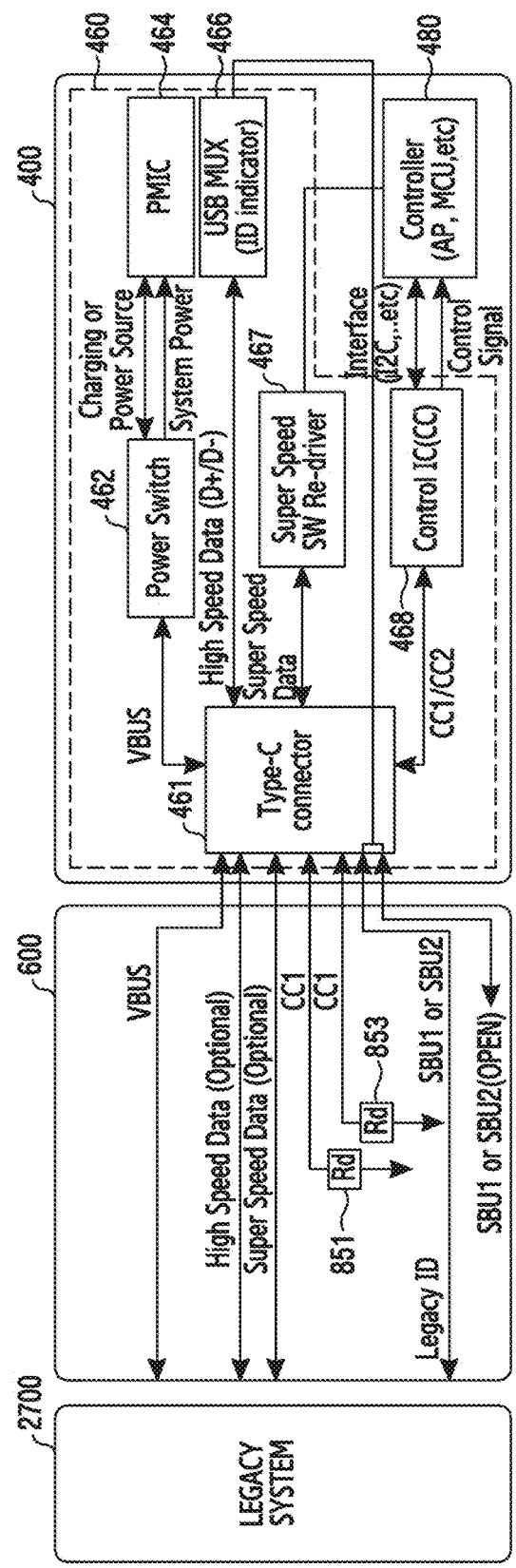

FIG. 14 is a diagram illustrating a configuration of a system for describing operations for providing an interface between devices according to various embodiments of the present disclosure.

Referring to FIG. 14, the system of FIG. 14 according to various embodiments may represent, for example, an example of a case where there is no configuration for the power switch and the control IC in the gender 600 unlike FIG. 7.

Referring to FIG. 14, there may be presented a case of providing compatibility between electronic devices having different interface standards by utilizing a debug mode. According to an embodiment of the present disclosure, FIG. 14 represents, when utilizing the debug mode, a circuit configuration of applying (for example, CC1=CC2) a pull-down (for example, Rd) to the USB 3.1 Type-C interface of the CC (for example, CC1 851 and CC2 853).

In various embodiments of the present disclosure, when recognizing the pull-down through CC1 851 and CC2 853, the gender 600 may enter into the debug mode in response to the connection of the legacy system 2700 and the electronic device 400. After entering into the debug mode, the gender 600 may be implemented in a form which can identify which kind of mode the analog ID information (for example, legacy ID, USB ID) acquired from the legacy system 2700 is to be operated in, and transmit the result to the SBU (for example, SBU1 or SBU2).

Referring to FIG. 14, the CC1 851 and CC2 of the USB 3.1 Type-C interface are configured to have the same level of resistance (for example, Rd (for example, 5.1K)), and the electronic device 400 may recognize the debug mode when the Type-C connector 461 detects the pull-down through the CC1 851 and CC2 853. When recognizing the debug mode, the electronic device 400 may be switched to the legacy recognition mode for recognizing the legacy system 2700 and check the ID through the SBU1 or SBU2 or the Type-C connector 461. For example, as the <conditions> below, when the legacy ID is detected from the SBU1, the SBU2 detects 'open', and the SBU1 uses the row, the electronic device 400 may take advantage of the SBU by substituting the CC.

<Conditions>
IF SBU 1=Legacy ID and SBU 2=OPEN, THEN SBU 1 row is available

In various embodiments of the present disclosure, corresponding to FIG. 14, the CC1 851 and CC2 853 are configured to have different levels of resistance (for example, CC1=Rd, CC2=Rv), and when the Type-C connector 461 detects the different levels of resistors through the CC1 851 and CC2 853, the electronic device 400 may recognize the ID of the legacy system 2700 through the SBU. For example, when the CC1 851 or CC2 853 of the host (DFP) (for example, the gender 600) recognizes the pull-down, it is possible to check whether the CC1 851 and CC2 853 have the same level of resistance. According to an embodiment of the present disclosure, the current or a voltage in CC1 851 and CC2 853 may be checked. When the CC1 851 and the CC2 853 are different with each other, it can be recognized as a dedicated mode, and the SBU can be substituted for the CC in the dedicated mode.

Figure 15:
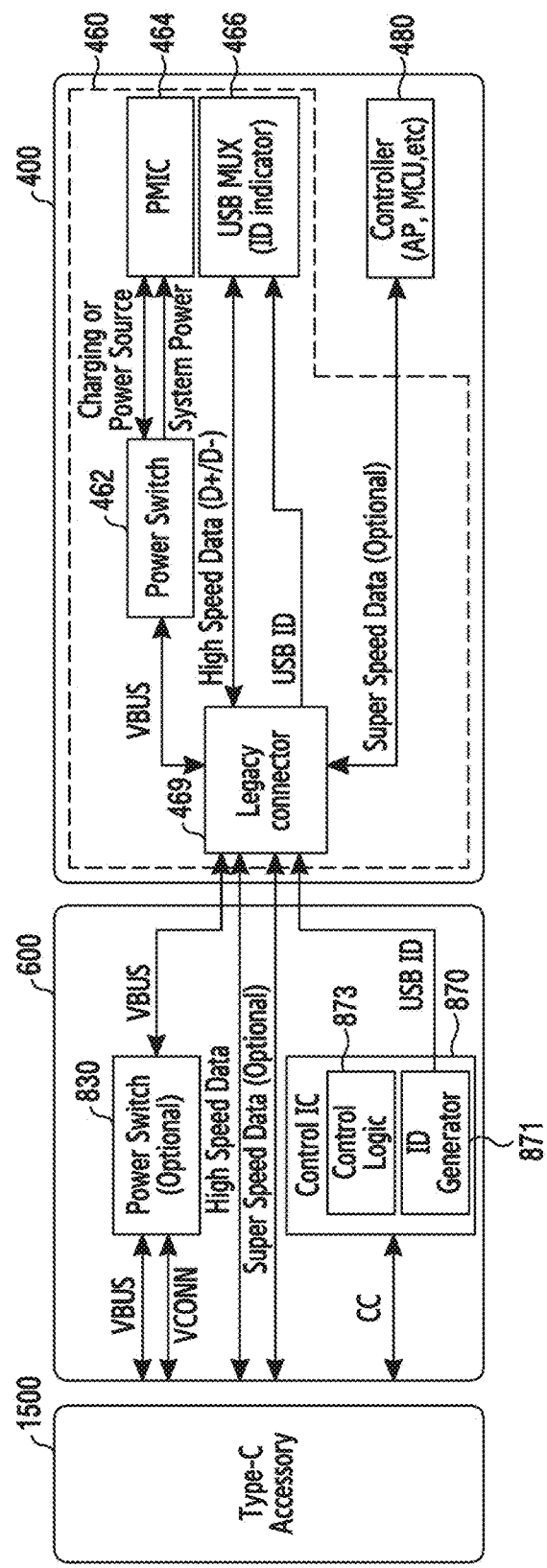
Figure 16:
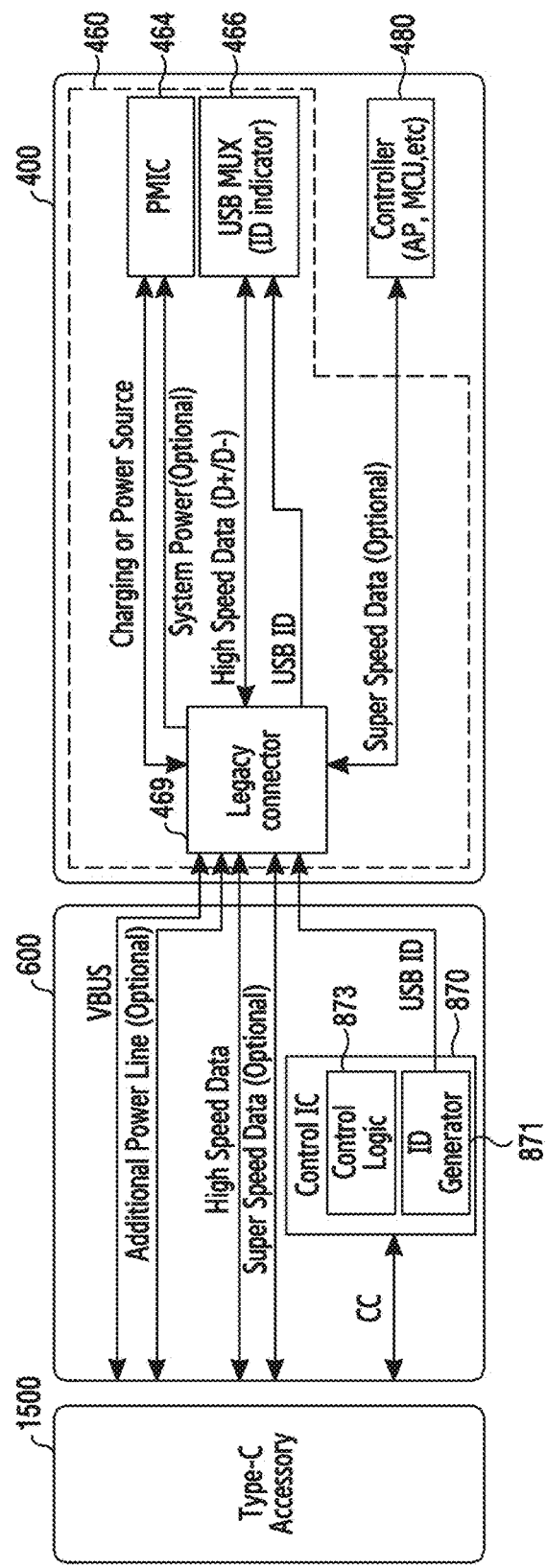

FIGS. 15 and 16 are diagrams illustrating a configuration of a system for describing operations for providing an interface between devices according to various embodiments of the present disclosure.

Referring to FIGS. 15 and 16, a system according to various embodiments may indicate an example of a case where, for example, unlike FIG. 7, the electronic device 400 belongs to a legacy system supporting the USB 2.0 interface and not the USB 3.1 Type-C interface, and the accessory supports the USB 3.1 Type-C interface. For example, FIGS. 15 and 16 may represent a recognition scenario such as, the legacy electronic device 400 and a Type C-accessory 1500 (for example, PC, charger, etc.).

In various embodiments of the present disclosure, FIG. 15 may illustrate an example in which the gender 600 includes a power switch 830 for separating the power path, and FIG. 16 may illustrate an example in which the gender 600 does not include the power switch 830 for separating the power path.

Referring to FIG. 16, an additional power line for VCONN may be selectively implemented.

Referring to FIGS. 15 and 16, in the gender 600, the control IC 870 may include the control logic 813 and the ID generator 871. When the Type-C accessory 1500 and the legacy electronic device 400 are connected, the gender 600 may recognize a type of accessory as the Type-C Accessory 1500 on the basis of the digital ID information (for example, interrupt) transmitted through the CC (for example, CC1 or CC2) from the control logic 873. In response to the recognized type of accessory by the gender 600, the ID generator 871 may generate analog ID information (for example, resistance value, USB ID) which can be recognized by the legacy electronic device 400. The gender 600 may transmit the generated analog ID information through a legacy connector 469 of the legacy electronic device 400.

The legacy electronic device 400 may provide, to an ID indicator pre-defined in the USB MUX 466, the analog ID information (for example, USB ID) transmitted through at least one (for example, D+ or D−) of the electrical paths of the legacy connector 469. The legacy electronic device 400 may receive the analog ID information through the electrical path of the legacy connector 469, and, through the analog ID information, interpret data (a resistance value corresponding to analog ID information) transmitted through the ID indicator of the USB MUX 466.

Figure 17:
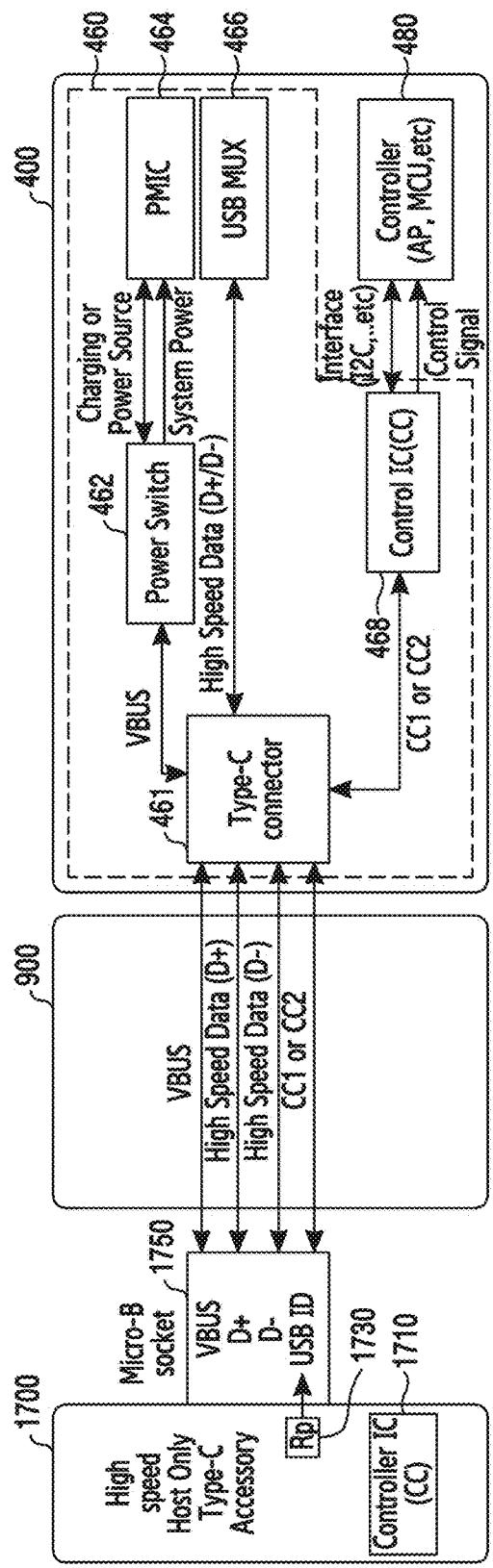

FIG. 17 is a diagram illustrating a system configuration for describing operations for providing an interface between devices according to various embodiments of the present disclosure.

Referring to FIG. 17, the system according to various embodiments may represent a scenario for recognizing a case where, for example, unlike FIGS. 15 and 16, the electronic device 400 supports the USB 3.1 Type-C interface and the accessory supports only the high speed host only Type-C accessory 1700 (for example, charger, etc.). FIG. 17 may represent a case where devices are connected with each other, without a gender 600, through a cable 900 (for example, USB 2.0 Micro-B to USB 3.1 Type-C). The host only Type-C accessory 1700 may include a controller IC 1710, a pull-up resistor (for example, Rp) 1730, and a Micro-B socket (or connector) 1750.

Referring to FIG. 17, when the host only Type-C accessory 1700 (for example, charger) includes the controller IC 1710, the pull-up resistor (Rp) 1730 may be applied to the USB ID pin of the Micro-B socket 1750. The USB ID to which the pull-up is applied may be directly coupled to the CC of the cable 900, and directly transmitted to the C-type connector 461 of the electronic device 400 through the CC of the cable 900. In such a case of FIG. 17, the wiring of the cable 900 can be minimized to have only VBUS, D+, D−, CC, and GND.

The electronic device 400 connected through the host only Type-C accessory 1700 and the cable 900 may detect the connection of an external device (for example, host-only type C accessories 1700), and recognize that the external device which is connected through the USB ID transmitted to the CC is the host only Type-C accessory 1700.

Figure 18:
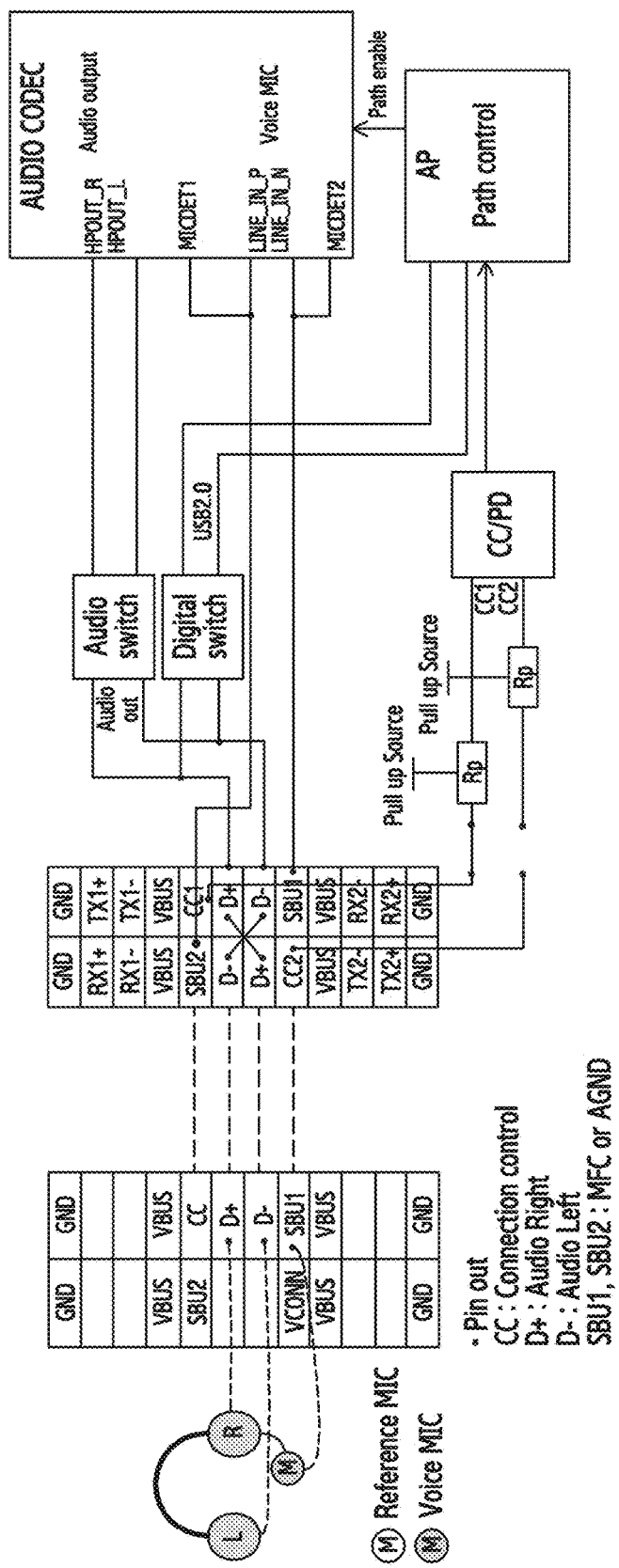
FIGS. 18 to 20 are diagrams illustrating a system configuration for describing operations for providing an interface between devices according to various embodiments of the present disclosure.
Figure 19:
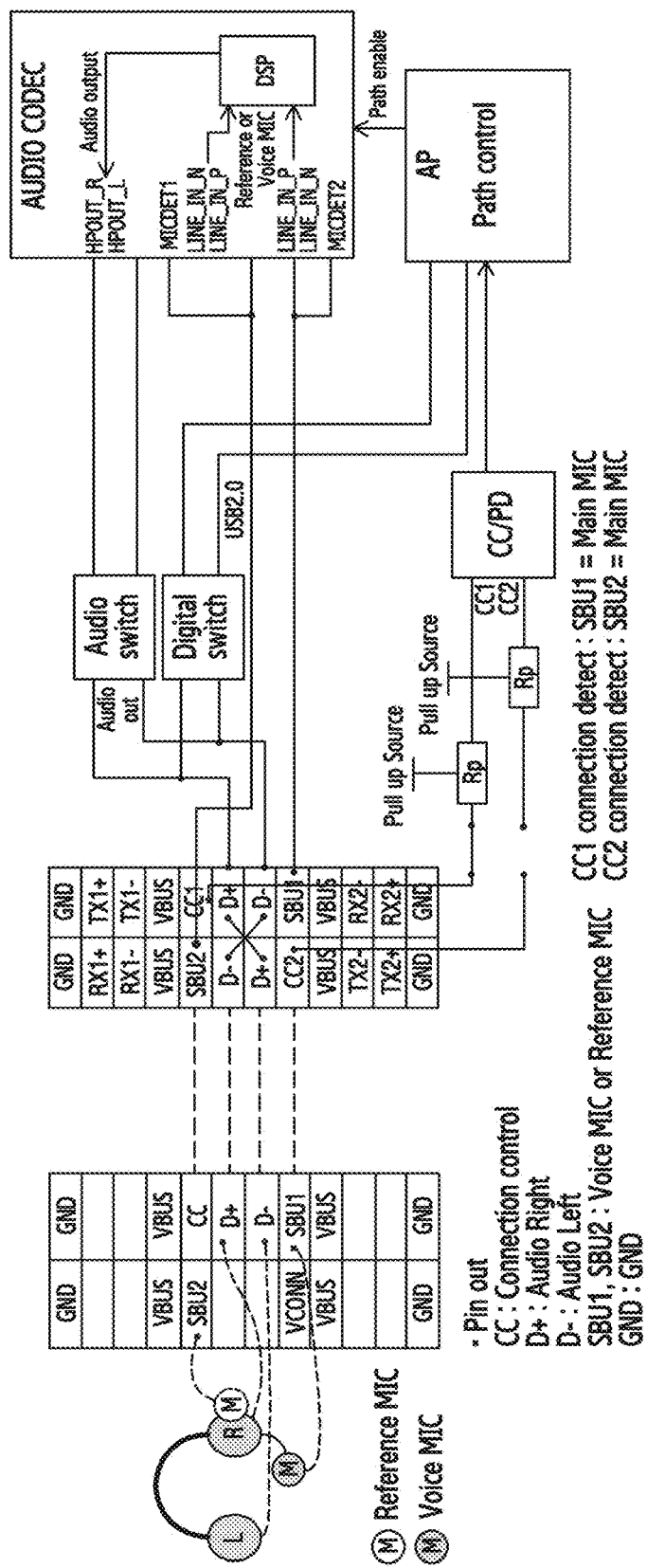
Figure 20:
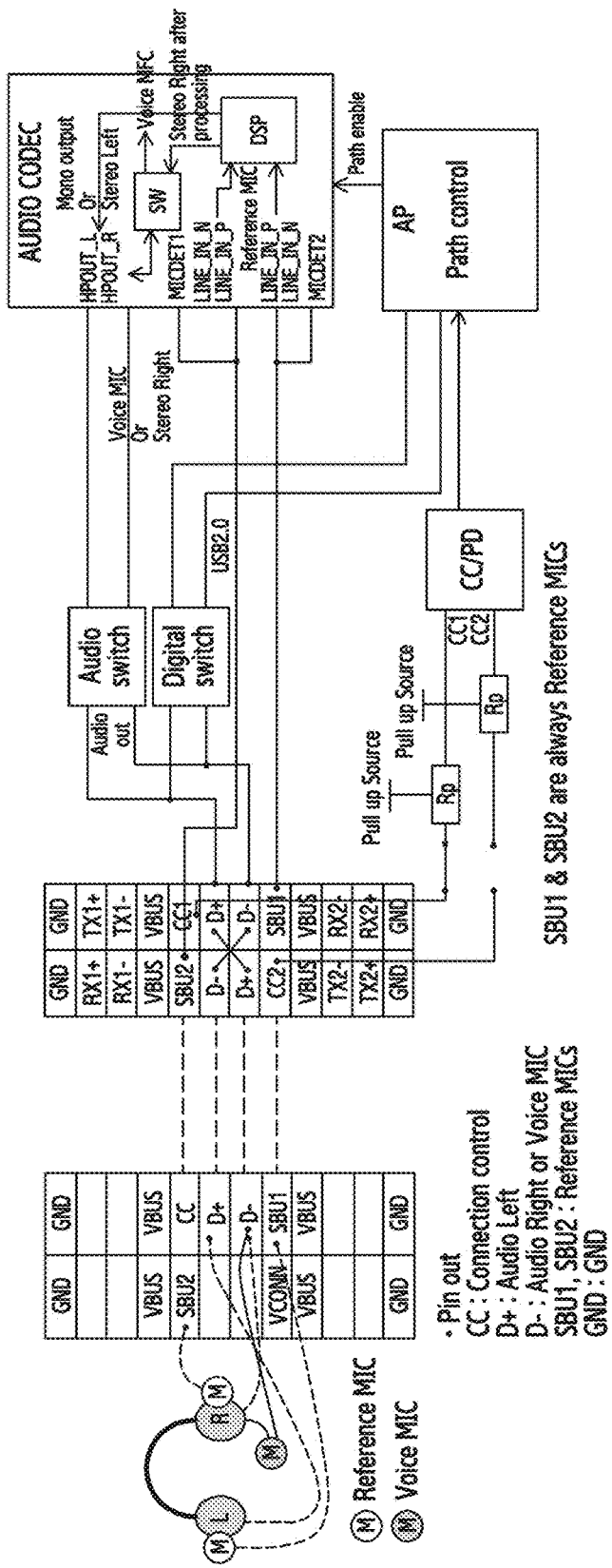

FIGS. 18 to 20 are diagrams illustrating a system configuration for describing operations for providing an interface between devices according to various embodiments of the present disclosure.

FIGS. 18 to 20 may represent an example of a case where a Type-C audio accessory is connected to the electronic device 400 through a USB 3.1 Type-C interface. In the example of the FIGS. 18 to 20, an ID corresponding to the Type-C audio accessary may be provided through a CC (for example, CC1 or CC2), and an SBU (for example, SBU1 or SBU2) audio signal (for example, an input signal such as MIC) may be extended and provided.

For example, when an audio accessory mode defined by DP (D+), DM (D−), SBU1, and SBU2 is implemented as it is, an audio performance degradation may become high due to a problem of sharing the DP/DM of the USB 2.0 interface, and the scalability thereof may be limited due to the restriction in the pin-out. Thus, in the case of the Type-C audio accessory, the above-mentioned problems can be solved by utilizing an SBU.

In various embodiments of the present disclosure, FIG. 18 may represent an example of the case where an audio accessory operates as a basic function (for example, 1-MIC). Referring to FIG. 18, the SBU 1 and SBU 2 which are MIC pins may be directly assigned to AUDIO CODEC line inputs of the electronic device 400. In such a case, a differential circuit may be configured, two ports assignment can be made, and a separate switching circuit implementation may be omitted in the audio codec.

According to various embodiments of the present disclosure, for the key input impedance detection, MIC ports may be configured to be individually connected to the differential ports so as to implement the circuit simplification. In addition, a circuit for preventing the performance degradation of a stereo audio signal due to the switching of the DP/DM port may be implemented. For example, an audio switching path for only a stereo audio path may be added, and a switch IC is arranged in the vicinity of the Type-C connector so that signal integrity performance degradation due to the USB 2.0 can be prevented.

In various embodiments of the present disclosure, FIG. 19 may represent an example of a case where an audio accessory operates as a multi-function (for example, 2-MIC). Referring to FIG. 19, the MIC may be assigned to each of the Type-C SBU1 and SBU2. For example, it may be configured as shown in Table 2 below.

TABLE 2

| Port | Conventional pin-out | Proposed pin-out |
|---|---|---|
| CC | Connection Control | Connection Control |
| D+ | Audio Right | Audio Right |
| D− | Audio Left | Audio Left |
| SBU1, SBU2 | MIC or GND | MIC & MIC |
| GND | Don't care | GND |

In various embodiments of the present disclosure, an MIC signal received from an audio accessary (for example, a headset) may be input to an audio CODEC of the electronic device 400 so that a MIC-related solution such as active noise cancelling (ANC) may be driven for the DSP inside the CODEC. In various embodiments of the present disclosure, a headset multi-key input processing may be configured in an active or passive type.

According to an embodiment of the present disclosure, in the passive type, it may be configured to recognize the impedance detection of the SBU1 and SBU2 through an audio codec or an external detection circuit, and for the active type, when the VDM generator is included in the circuit unit of the audio accessory (for example, a headset), a digital ID may be generated through the CC.

In various embodiments of the present disclosure, a method for recognizing the first microphone (1st MIC) and second microphone (2nd MIC) may configure the first microphone and second microphone according to the CC1 or CC2 connection. According to an embodiment of the present disclosure, for the CC1 connection, it may be implemented such that SBU1=first microphone and SBU2 second microphone, and for the CC2 connection, it may be implemented such that SBU1=second microphone and SBU2=first microphone. Additionally or alternatively, it may be implemented by adding a switch for controlling a path between SBU1 and SBU2.

In various embodiments of the present disclosure, FIG. 20 may represent a case where an audio accessory operates as a multi-function (for example, 3-MIC), for example, a Type-C headset including reference microphones (Reference MICs) and a voice microphone (voice MIC) in order to secure audio data. In various embodiments of the present disclosure, the basic pin connection may be configured as illustrated in Table 3 below.

TABLE 3

| Port | Pin-out |
|---|---|
| CC | Connection Control |
| SBU1, SBU2 | Ref MIC1 & Ref MIC2 |
| D+ or D− | Voice MIC |
| GND | GND |

In various embodiments of the present disclosure, according to the audio data processing, data of the reference microphones (e.g., Ref MIC1, Ref MIC2) may be transmitted to the electronic device 400 through the SBU1 and SBU2, and the electronic device 400 may perform signal processing on the data input through the SBU1 and SBU2 based on the DSP of the audio codec.

In various embodiments of the present disclosure, the pin connection according to stereo music play or a voice call may be configured as illustrated in Table 4 below.

TABLE 4

| Port | Stereo music play | Voice call |
|---|---|---|
| CC | Connection Control | Connection Control |
| D+ | Stereo Right | Mono headphone out or voice MIC |
| D− | Stereo Left | voice MIC or Mono headphone out |
| SBU1, SBU2 | Ref MIC1 & Ref MIC2 | Ref MIC1 & Ref MIC2 |
| GND | GND | GND |

In various embodiments of the present disclosure, a reference MIC calibration process for an ANC may be provided. For example, the calibration may be processed at each time when an internal memory of the audio accessory is added or the electronic device 400 is inserted into the internal audio codec DSP inside the electronic devices 400.

In order to solve the above problem, a method and apparatus for providing an interface according to various embodiments may secure the compatibility between different types (standards) of interfaces. For example, various embodiments may ensure the compatibility between an electronic device which has a high level interface standard (for example, a USB 3.1 Type C interface) and a legacy system (for example, a USB 2.0 accessory such as a generally-used OTG, data cable, wall charger, etc.) which has a low level interface standard (for example, a USB 2.0 standard pin-out interface such as Micro A, B, AB, etc.).

According to various embodiments of the present disclosure, the problem in that the legacy system has limitations in application can be solved, when applying a USB Type-C to an electronic device, by ensuring the compatibility of the electronic device and the USB interface-based legacy system which is commonly used in various ways according to the related art. In addition, according to various embodiments of the present disclosure, malfunction issues may be prevented between an electronic device and a legacy system, and the electronic device and the legacy system can be compatible with each other without changing the legacy system and the manufacturing process equipment according to the related art.

According to various embodiments of the present disclosure, an interface method and apparatus for ensuring compatibility between high level interface standards and low level interface standards is provided, thereby improving a user's convenience and the usability and convenience of the electronic device.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. An electronic device comprising:
   a housing;
   a first connector configured to be exposed to outside of the housing and include a first number of pins;
   a second connector configured to be exposed to the outside of the housing and to include a second number of pins; and
   a circuit configured to provide an electrical connection between the first number of pins and the second number of pins,
   wherein the first number is different from the second number,
   wherein, when the first connector is connected with a first external electronic device and the second connector is connected with a second external electronic device, the circuit is further configured to:
      receive, from the first external electronic device, analog identification (ID) information of the first external electronic device through at least one pin among the first number of pins, and
      generate, at least partially based on the analog ID information, digital ID information of the first external electronic device so as to provide the digital ID information to at least one of the second number of pins,
   wherein the first connector comprises an asymmetrical shape in at least one direction, and
   wherein the second connector comprises a symmetrical shape in at least two directions.

2. The electronic device of claim 1, wherein the first number is less than the second number.

3. The electronic device of claim 2, wherein the first number of pins is five, and the second number of pins is 24.

4. The electronic device of claim 1, wherein the electronic device comprises a gender or a cable configured to support different interface standards.

5. The electronic device of claim 4, wherein the different interface standards comprise a universal serial bus (USB) 2.0 interface and a USB Type-C interface.

6. The electronic device of claim 1, wherein the circuit is further configured to:
   acquire, from the first external device, at least one among analog ID information, data information, or power information associated with the external device with respect to the electronic device;
   convert the analog ID information into digital ID information; and
   provide the data information or the power information through a first path and provide the digital ID information through a second path.

7. The electronic device of claim 6, wherein the circuit is further configured to convert the analog ID information into the digital ID information without determining a type of the first external device.

8. A method for operating an electronic device comprising a first connector and a second connector, the method comprising:
   detecting a connection of external electronic devices through the first connector and the second connector, wherein the external electronic devices comprise a first external electronic device and a second external electronic device, and wherein the first connector is connected with the first external electronic device and the second connector is connected with the second external electronic device;
   receiving, from the first external electronic device, analog identification (ID) information of the first external electronic device through at least one of a first number of pins of the first connector;
   generating, at least partially based on the analog ID information of the first external device, digital ID information of the first external device; and
   providing the generated digital ID information of the first external device to at least one of a second number of pins of the second connector,
   wherein the first number is different from the second number,
   wherein the first connector comprises an asymmetrical shape in at least one direction, and
   wherein the second connector comprises a symmetrical shape in at least two directions.

9. The method of claim 8, wherein the analog ID information or digital ID information comprises universal serial bus (USB) IDs of the external electronic devices connected to the first connector or the second connector.

10. The method of claim 9, wherein receiving of the analog ID information comprises acquiring, from the external electronic devices, at least one of analog ID information, data information, or power information associated with the external electronic device.

11. The method of claim 10, further comprising:
   providing the data information or the power information through a first path; and providing the converted digital ID information through a second path.

12. A method for operating an electronic device having a connector, the method comprising:
connecting to an external device through the connector;
receiving, from the external device, analog identification (ID) information of the external device through at least one pin of the connector;
transmitting the received analog ID information of the external device through an electrical path electrically connected to the connector;
generating, at least partially based on the analog ID information of the external device, digital ID information of the external device; and
determining, based on the digital ID information of the external device, information to be transmitted to the external device,
wherein receiving the analog ID information of the external device further comprises:
receiving first information through at least one pin corresponding to a first path of the connector; and
receiving second information through at least one other pin corresponding to a second path of the connector.

13. The method of claim 12, further comprising:
identifying, based on the digital ID information of the external device, the external device;
determining performance information corresponding to the identified external device; and
communicating, based on the determined performance information, with the external device.

14. The method of claimer 12, further comprising:
generating digital ID information corresponding to the received first information;
identifying, based on the digital ID information of the external device, the external device; and
processing, based on the second information, an operation which is associated with the external device.

* * * * *